(12) United States Patent
Guo

(10) Patent No.: US 12,211,564 B2
(45) Date of Patent: Jan. 28, 2025

(54) MEMORY DEVICE, METHOD FOR PROGRAMMING MEMORY DEVICE, PROGRAM VERIFICATION METHOD AND MEMORY SYSTEM

(71) Applicant: YANGTZE MEMORY TECHNOLOGIES CO., LTD., Wuhan (CN)

(72) Inventor: Xiaojiang Guo, Wuhan (CN)

(73) Assignee: YANGTZE MEMORY TECHNOLOGIES CO., LTD., Wuhan (CN)

( * ) Notice: Subject to any disclaimer, the term of this patent is extended or adjusted under 35 U.S.C. 154(b) by 208 days.

(21) Appl. No.: 18/091,231

(22) Filed: Dec. 29, 2022

(65) Prior Publication Data
US 2023/0148366 A1    May 11, 2023

Related U.S. Application Data

(63) Continuation of application No. PCT/CN2021/115699, filed on Aug. 31, 2021.

(51) Int. Cl.
*G11C 16/34* (2006.01)
*G11C 16/10* (2006.01)
*G11C 29/52* (2006.01)

(52) U.S. Cl.
CPC ........ *G11C 16/3459* (2013.01); *G11C 16/102* (2013.01); *G11C 29/52* (2013.01)

(58) Field of Classification Search
CPC .... G11C 16/3459; G11C 16/102; G11C 29/52
See application file for complete search history.

(56) References Cited

U.S. PATENT DOCUMENTS 8,611,155 B2 * 12/2013 Kim .................... G11C 16/3454
                                                     365/185.19
9,406,393 B2 *  8/2016 Park ....................... G11C 16/08
(Continued)

FOREIGN PATENT DOCUMENTS

| CN | 102157204 A | 8/2011 |
| CN | 105390157 A | 3/2016 |

(Continued)

*Primary Examiner* — Son L Mai
(74) *Attorney, Agent, or Firm* — BAYES PLLC

(57) ABSTRACT

A memory device, a method for programming the memory device, a program verification method, and a memory system are provided. In the program verification method, an $i^{th}$ verification result of an $i^{th}$ program verification operation is obtained, where programming states verified by the $i^{th}$ program verification operation range from an $n^{th}$ state to an $(n+k)^{th}$ state, i and n are positive integers, k is a natural number, and the $(n+k)^{th}$ state is less than or equal to a highest programming state of the memory device; a range of programming states to be verified by an $(i+1)^{th}$ program verification operation is determined according to a verification sub-result for the $n^{th}$ state and a verification sub-result for the $(n+k)^{th}$ state in the $i^{th}$ verification result; and the $(i+1)^{th}$ program verification operation is executed according to the determined range of the programming states to be verified by the $(i+1)^{th}$ program verification operation.

20 Claims, 10 Drawing Sheets

Obtain an $i^{th}$ verification result of an $i^{th}$ program verification operation. Herein, programming states verified by the $i^{th}$ program verification operation range from an $n^{th}$ state to an $(n + k)^{th}$ state, i and n are positive integers, k is a natural number, and the $(n + k)^{th}$ state is less than or equal to a highest programming state of the memory device — S100

Determine a range of programming states to be verified by the $(i + 1)^{th}$ program verification operation according to a verification sub-result for the $n^{th}$ state and a verification sub-result for the $(n + k)^{th}$ state in an $i^{th}$ verification result — S110

Execute the $(i + 1)^{th}$ program verification operation according to the determined range of the programming states to be verified by the $(i + 1)^{th}$ program verification operation — S120

(56) References Cited

U.S. PATENT DOCUMENTS

| | | | |
|---|---|---|---|
| 11,031,084 B1* | 6/2021 | Lee | ................... G11C 16/0483 |
| 2015/0348633 A1 | 12/2015 | Song et al. | |

FOREIGN PATENT DOCUMENTS

| | | | |
|---|---|---|---|
| CN | 106981306 A | 7/2017 |
| CN | 108133732 A | 6/2018 |
| CN | 110349607 A | 10/2019 |
| CN | 111599400 A | 8/2020 |
| CN | 112825260 A | 5/2021 |

* cited by examiner

MEMORY DEVICE, METHOD FOR PROGRAMMING MEMORY DEVICE, PROGRAM VERIFICATION METHOD AND MEMORY SYSTEM

CROSS-REFERENCE TO RELATED APPLICATION

This application is a continuation of International Application No. PCT/CN2021/115699, filed on Aug. 31, 2021, the entire content of which is hereby incorporated by reference in its entirety.

TECHNICAL FIELD

The implementation of the disclosure relates to, but is not limited to, the semiconductor field, and in particular to a memory device, a method for programming the memory device, a program verification method, and a memory system.

BACKGROUND

Flash memories are widely used as storage media for portable electronic devices such as mobile phones and digital cameras. Flash memories typically use single-transistor memory cells that allow for high memory density, high reliability, and low power consumption. By programming a charge storage structure (e.g., floating gate or charge trap) or other physical phenomena (e.g., phase transition or ferroelectricity), a change of a threshold voltage of each memory cell determines a data state (e.g., data value) of the memory cell.

After applying a programming pulse to a memory device for programming the memory device, a program verification operation is needed. The times for applying the programming pulse and the number of program verification operations are factors that determine programming time. Therefore, how to shorten the programming time under the premise of ensuring programming quality has become an urgent problem to be solved.

SUMMARY

The implementation of the disclosure provides a memory device, a method for programming the memory device, a program verification method, and a memory system.

According to a first aspect of an implementation of the present disclosure, there is provided a program verification method for a memory device, comprising: obtaining an $i^{th}$ verification result of an $i^{th}$ program verification operation, wherein programming states verified by the $i^{th}$ program verification operation range from an $n^{th}$ state to an $(n+k)^{th}$ state, i and n are positive integers, k is a natural number, and the $(n+k)^{th}$ state is less than or equal to a highest programming state of the memory device; determining a range of programming states to be verified by an $(i+1)^{th}$ program verification operation according to a verification sub-result for the $n^{th}$ state and a verification sub-result for the $(n+k)^{th}$ state in the $i^{th}$ verification result; and executing the $(i+1)^{th}$ program verification operation according to the determined range of the programming states to be verified by the $(i+1)^{th}$ program verification operation.

According to a second aspect of an implementation of the present disclosure, there is provided a method of programming a memory device, comprising: applying an $(i+1)^{th}$ programming pulse to to-be-programmed memory cells in the memory device; in a process of applying the $(i+1)^{th}$ programming pulse, counting fail bits in programming for an $n^{th}$ state and in programming for an $(n+k)^{th}$ state in an $i^{th}$ programming operation according to a verification result for an $n^{th}$ state and a verification result for an $(n+k)^{th}$ state in the $i^{th}$ programming operation, to obtain an $i^{th}$ count result; wherein programming states verified by the $i^{th}$ program verification operation range from the $n^{th}$ state to the $(n+k)^{th}$ state, i and n are positive integers, k is a natural number, and the $(n+k)^{th}$ state is less than or equal to a highest programming state of the memory device; determining a range of programming states to be verified by an $(i+1)^{th}$ program verification operation according to the $i^{th}$ count result; and executing the $(i+1)^{th}$ program verification operation according to the determined range of the programming states to be verified by the $(i+1)^{th}$ program verification operation.

According to a third aspect of an implementation of the present disclosure, there is provided a memory device comprising: a memory cell array comprising memory cell rows; word lines coupled to the memory cell rows respectively; and a peripheral circuit coupled to the word lines and configured to execute program verification operation on a selected memory cell row from the memory cell rows, the selected memory cell row coupled to a selected word line, wherein in order to execute the program verification operation, the peripheral circuit is configured to: obtain an $i^{th}$ verification result of an $i^{th}$ program verification operation, wherein programming states verified by the $i^{th}$ program verification operation range from an $n^{th}$ state to an $(n+k)^{th}$ state, i and n are positive integers, k is a natural number, and the $(n+k)^{th}$ state is less than or equal to a highest programming state of the memory device; determine a range of programming states to be verified by the (i+1)th program verification operation according to a verification sub-result for the nth state and a verification sub-result for the (n+k)th state in the ith verification result; and execute the $(i+1)^{th}$ program verification operation according to the determined range of programming states to be verified by the $(i+1)^{th}$ program verification operation.

According to a fourth aspect of an implementation of the present disclosure, there is provided a memory comprising: a memory cell array comprising memory cell rows; word lines coupled to the memory cell rows, respectively; and a peripheral circuit coupled to the word lines and configured to execute programming operation on a selected memory cell row from the memory cell rows, the selected memory cell row coupled to the selected word line, wherein in order to execute the programming operation, the peripheral circuit is configured to: apply an $(i+1)^{th}$ programming pulse to a to-be-programmed memory cell in the memory device; in a process of applying the (i+1) programming pulse, count fail bits in programming for an $n^{th}$ state and in programming for an $(n+k)^{th}$ state in the $i^{th}$ programming operation according to a verification result for the $n^{th}$ state and the verification result for the $(n+k)^{th}$ state in the $i^{th}$ programming operation, to obtain an $i^{th}$ count result, wherein the programming states verified by the $i^{th}$ program verification operation range from the $n^{th}$ state to the $(n+k)^{th}$ state, i and n are positive integers, k is a natural number, and the $(n+k)^{th}$ state is less than or equal to a highest programming state of the memory device; determine a range of programming states to be verified by an $(i+1)^{th}$ program verification operation according to the $i^{th}$ count result; and execute the $(i+1)^{th}$ program verification operation according to the determined range of programming states to be verified by the $(i+1)^{th}$ program verification operation.

According to a fifth aspect of an implementation of the present disclosure, there is provided a memory system comprising: one or more memory devices as described in the third aspect of the present disclosure or in the fourth aspect of the present disclosure; and a memory controller coupled to the memory devices and configured to control the memory devices.

DETAILED DESCRIPTION

Figure 1:
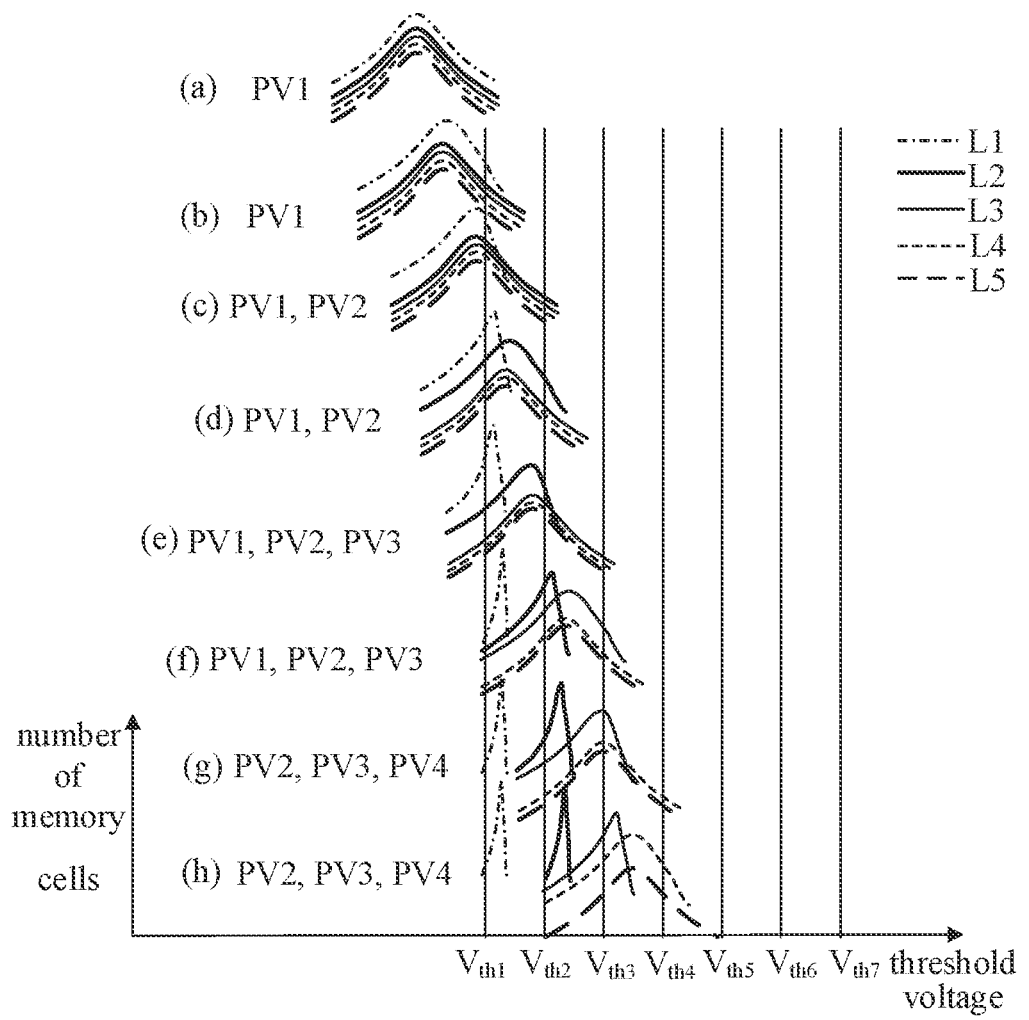
FIG. 1 is a threshold voltage distribution diagram of a programming operation illustrated according to an implementation of the present disclosure.

In order to make the object, technical scheme, and advantages of the present disclosure clearer, the technical scheme of the present disclosure will be further described in detail below in conjunction with the accompanying drawings and implementations. While the implementations of the present disclosure are shown in the drawings, it should be understood that the present disclosure may be implemented in various forms and should not be limited by the implementations set forth herein. Rather, these implementations are provided to promote understanding of the disclosure and to convey the scope of the disclosure to those skilled in the art.

The present disclosure is described by way of examples in the following paragraphs with reference to the accompanying drawings. The advantages and features of the present disclosure will become clearer from the following description and claims. It is to be noted that the drawings are all in a very simplified form and use imprecise proportions for convenience and clarity only to aid in illustrating the purpose of the disclosed implementations.

It is understood that the meanings of "on," "on top of," and "above" in the present disclosure should be interpreted in the widest manner so that "on" not only means its meaning of "on" something without intervening features or layers (i.e., directly on something), but also includes "on" something with intervening features or layers.

In the implementations of the present disclosure, the term "A connected to B" includes a case where A and B are in contact connection with each other, or a case where A is in contactless connection with B with other components interposed between A and B.

In the implementations of the present disclosure, the terms "first," "second," etc. are used to distinguish similar objects and need not be used to describe a particular order or priority. It will be appreciated that the "first," "second," and the like may be interchanged in a particular order or priority where permissible, to enable the implementations of the disclosure described herein to be implemented in an order other than that illustrated or described herein.

In the implementations of the present disclosure, the term "layer" refers to a portion of material that includes a region having a thickness. The "layer may extend over the entirety of the lower or upper structure, or may have a range smaller than the range of the lower or upper structure. Further, the "layer" may be a region of a homogeneous or heterogeneous continuous structure whose thickness is less than the thickness of the continuous structure. For example, the "layer" may be located between the top and bottom surfaces of the continuous structure, or the "layer" may be located between any horizontal surface at the top and bottom surfaces of the continuous structure. The "layer" may extend horizontally, vertically, and/or along an inclined surface. The "layer" may include a plurality of sub-layers. For example, an interconnection layer may include one or more conductor and contact sub-layers in which interconnection lines and/or via contacts are formed, and one or more dielectric sub-layers.

Unless otherwise defined, all technical and scientific terms used herein have the same meanings as are commonly understood by those skilled in the art of the present disclosure. The terminology used herein is for the purpose of describing implementations of the present disclosure only and is not intended to limit the present disclosure.

It should be noted that the technical schemes described in the implementation of the present disclosure can be arbitrarily combined without conflict.

NAND memory is a non-volatile memory device that adopts a non-linear macro-cell mode internally, and has the advantages of large capacity and fast rewriting speed, so it is suitable for storing a large amount of data. The NAND memory is widely applied in embedded products, such as digital cameras, memory cards for MP3 players, compact U disks, and so on.

In the development of the NAND memory, memory cells of early NAND memory particles are mostly Single-Level Cells (SLCs), that is, one memory cell stores 1 bit of data, and at this time, each memory cell has two states, namely, 0 and 1.

With the development of the NAND memory, the memory cells of the NAND memory particles gradually evolved from SLCs to Multi-Level Cells (MLCs), that is, one memory cell stores 2 bits of data, and then to Triple-Level Cells (TLCs), that is, one memory cell stores 3 bits of data, or even Quad-Level Cells (QLCs), that is, one memory cell stores 4 bits of data. Correspondingly, the number of states of a memory cell of a NAND memory particle changes from 2 to 4, 8, or even 16.

The operation of the NAND memory includes three aspects: erase operation, programming operation (write operation) and read operation. The erase operation can be executed in blocks, and the programming operation and the read operation can be executed in pages. For the programming operation of NAND memory, the process is divided into operations including: voltage programming (i.e., applying programming pulses), program verifying (PV), and verification result scanning.

For the NAND memory, programming time ($t_{PROG}$) is a crucial performance spec for the NAND memory. Therefore, research and development personnel have been committed to studying how to improve the programming speed and shorten the programming time without compromising the programming quality (for example, ensuring a read budget window). Since a duration for applying programming pulses cannot be changed, the number of applied programming pulses, the number of program verifications, the time for each program verification, and the time for verification result scanning are all factors to determine the programming time.

Taking a TLC memory cell as an example, the TLC memory cell has one erase state and seven programming states, and the programming states are denoted as L1, L2, L3, L4, L5, L6, and L7 in turn from the first state to the seventh state. One programming method for the TLC is to initiate the program verification operation for each state between two adjacent programming pulses. The problems of this method lie in that, after applying the first programming pulse, only a very few memory cells actually reach the L1 state, and no memory cells reach the L2, L3, L4, L5, L6, or L7 states; if the program verification operation of at least one of the L2 to L7 states is started at this time, the number of program verification operations and the time for the program verification operations will be increased, and even the time spent in program verification operations and verification result scanning may occupy at least half of the whole programming process, which seriously reduces the programming speed.

In order to improve the programming speed, Table 1 shows the start loop corresponding to each program verification state in a program verification method.

TABLE 1

Program verification operations and start loops for different programming states

| Program Verification (PV) | Start loop |
| --- | --- |
| PV1 | 1 |
| PV2 | 3 |
| PV3 | 4 |
| PV4 | 5 |
| PV5 | 7 |
| PV6 | 9 |
| PV7 | 11 |

Herein, PV1 represents a program verification operation for the first state (L1), PV2 represents a program verification operation for the second state (L2), PV3 represents a program verification operation for the third state (L3), PV4 represents a program verification operation for the fourth state (L4), PV5 represents a program verification operation for the fifth state (L5), PV6 represents a program verification operation for the sixth state (L6), and PV7 represents a program verification operation for the seventh state (L7).

The start loop of a program verification operation can be defined by the number of programming pulses that have been applied before executing the program verification operation. For example, the start loop of the program verification operation for the first state is 1, which means that the program verification for the first state is started after the application of the first programming pulse and before the application of the second programming pulse.

During the programming operation, the programming of all to-be-programmed memory cells starts from the erase state. Generally, a threshold voltage of the programmed memory cell can be moved to a higher programming state only after multiple programming pulses are applied. Therefore, the programming speed can be improved by reducing the number of program verifications.

In some implementations, the programming method can eliminate the program verification operation for a higher programming state after the programming pulses are applied at an early stage. Referring to Table 1, the program verification method uses a fixed start loop to control when to start the program verification for each programming state. For example, the start loop of the program verification operation for the third state is set to 4, that is, after the first three programming pulses are applied, the program verification operation for the third state (i.e., PV3) is skipped, but the PV3 starts after the fourth programming pulse is applied.

The foregoing programming method can reduce the number of program verifications. However, considering that there will be differences in programming characteristics of different units that are programmed simultaneously, for each state, there will still be errors if all dies, blocks, or Word Lines (WLs) are set with the same start loop. Therefore, in order to ensure the programming quality, when setting the start loop of the program verification operation for each programming state, it should reserve enough margin, and when the programming units are different, it should set a respective fixed start loop of the program verification operation for each unit according to empirical values, which will consume a lot of circuit resources and increase the testing time.

In addition, the programming characteristics of the NAND are also affected by many other factors. For example, with variations of conditions such as the number of loops or the temperature, the performance of each memory cell will change, resulting in different programming performances of the NAND. Changes in these programming characteristics cannot be tracked by setting a fixed start loop for each programming verification operation, so a fixed start loop is not the most suitable start loop. When the fixed start loop set for a program verification operation is earlier than the most suitable start loop, starting the program verification too early will prolong the time for the verification operation, thus prolonging the programming time. When the fixed start loop set for the program verification operation is later than the most suitable start loop, over-programming may occur, and the programming quality may be reduced.

Taking a TLC as an example, FIG. 1 illustrates a diagram of threshold voltage distribution when executing a programming operation on a memory device according to an implementation. TLC has seven programming states, and only five programming states (i.e., L1 to L5) are shown as examples in FIG. 1.

Referring to FIG. 1, FIG. 1 illustrates eight curve sub-graphs, which are denoted as (a), (b), (c), (d), (e), (f), (g), and (h) in sequence. Each sub-graph includes five curves, each curve represents the distribution of memory cells with the same target programming state after the application of the programming pulse. $V_{th1}$, $V_{th2}$, $V_{th3}$, $V_{th4}$, $V_{th5}$, $V_{th6}$, and $V_{th7}$ represent starting threshold voltages of state 1, state 2, state 3, state 4, state 5, state 6, and state 7 respectively, as follows.

Sub-graph (a) shows a threshold voltage distribution curve obtained by executing a first program verification operation on memory cells after application of a first programming pulse starting from the erase state. The first program verification operation includes program verification (PV1) for the first state, that is, the range of programming states verified by the first program verification operation is L1.

Sub-graph (b) shows a threshold voltage distribution curve obtained by executing a second program verification operation on the memory cells after the application of a next programming pulse on the basis of Sub-graph (a), that is, Sub-graph (b) shows a threshold voltage distribution curve obtained by executing a second program verification operation on the memory cells after application of a second programming pulse starting from the erase state. The second program verification operation includes program verification (PV1) for the first state, that is, the range of programming states verified by the second program verification operation is L1.

If the start loop of executing PV2 is set to 2, in conjunction with the curve in Sub-graph (b) of FIG. 1, the threshold voltages of the memory cells are all smaller than the threshold voltage of the second state after application of the second programming pulse, and therefore it is unnecessary to perform the program verification for the second state after application of the second programming pulse.

That is, compared with the scheme of setting the start loop of the program verification operation for the second state to 3 (as shown in sub-graph (c) of FIG. 1), the scheme of setting the start loop of the program verification for the second state to 2 increases the time for the program verification, thereby increasing the programming time. That is to say, when the fixed start loop set for the programming verification operation is earlier than the most suitable start loop, starting the programming verification too early will prolong the verification operation time, and then prolong the programming time.

Sub-graph (c) shows a threshold voltage distribution curve obtained by executing a third program verification operation on the memory cells after the application of a next programming pulse on the basis of Sub-graph (b), that is, Sub-graph (c) shows a threshold voltage distribution curve obtained by executing a third program verification operation on the memory cells after application of the third programming pulse starting from the erase state. The third program verification operation includes program verification for the first state (PV 1) and program verification for the second state (PV2), and the range of programming states verified by the third program verification operation is L1 to L2.

Sub-graph (d) shows a threshold voltage distribution curve obtained by executing a fourth program verification operation on the memory cell after the application of a next programming pulse based on Sub-graph (c), that is, Sub-graph (d) shows a threshold voltage distribution curve obtained by executing a fourth program verification operation on the memory cells after application of the fourth programming pulse starting from the erase state. The fourth program verification operation includes program verification for the first state (PV1) and program verification for the second state (PV2), and the range of programming states verified by the fourth program verification operation is L1 to L2.

Sub-graph (e) shows a threshold voltage distribution curve obtained by executing a fifth program verification operation on the memory cells after the application of a next programming pulse on the basis of Sub-graph (d), that is, Sub-graph (e) shows a threshold voltage distribution curve obtained by executing a fifth program verification operation on the memory cells after application of the fifth programming pulse starting from the erase state. The fifth program verification operation includes program verification for the first state (PV1), program verification for the second state (PV2), and program verification for the third state (PV3), and the range of programming states verified by the fifth program verification operation is L1 to L3.

If the start loop of executing PV2 is set to 5, it can be seen from the curve shown in Sub-graph (e) of FIG. 1 that after the application of the fifth programming pulse, threshold voltages of some of the memory cells have been greater than the threshold voltage of the third state, that is, over-programming occurs. Therefore, over-programming would occur when starting the program verification for the second state after the application of the fifth programming pulse.

That is, compared with the scheme of setting the start loop of the program verification operation for the second state to 3 (as shown in Sub-graph (c) of FIG. 1), in the scheme of setting the start loop of the program verification operation for the second state to 5, over-programming occurs, and the programming quality is reduced. That is, when the fixed start loop set by the program verification operation is later than the most suitable start loop, over-programming may occur, and the programming quality may be reduced.

Sub-graph (f) shows a threshold voltage distribution curve obtained by executing a sixth program verification operation on the memory cells after the application of a next programming pulse based on Sub-graph (e), that is, Sub-graph (e) shows a threshold voltage distribution curve obtained by executing a sixth program verification operation on the memory cells after application of the sixth programming pulse starting from the erase state. The sixth program verification operation includes program verification for the first state (PV1), program verification for the second state (PV2), and program verification for the third state (PV3), and the range of programming states verified by the sixth program verification operation is L1 to L3.

Sub-graph (g) shows a threshold voltage distribution curve obtained by executing a seventh program verification operation on the memory cells after the application of a next programming pulse based on Sub-graph (1), that is, Sub-graph (g) shows a threshold voltage distribution curve obtained by executing a seventh program verification operation on the memory cells after application of a seventh programming pulse starting from an erase state. The seventh program verification operation includes program verification for the second state (PV2), program verification for the third state (PV3), and program verification for the fourth state (PV4), and the range of programming states verified by the seventh program verification operation is L2 to L4.

Sub-graph (h) shows a threshold voltage distribution curve obtained by executing an eighth program verification operation on the memory cells after the application of a next programming pulse based on Sub-graph (g), that is, Sub-graph (h) shows a threshold voltage distribution curve obtained by executing an eighth program verification operation on the memory cells after application of the eighth programming pulse starting from the erase state. The eighth program verification operation includes program verification for the second state (PV2), program verification for the third state (PV3), and program verification for the fourth state (PV4), and the range of programming states verified by the eighth program verification operation is L2 to L4. The rest can be done in the same manner, until the programming is completed.

As can be seen from FIG. 1, the threshold voltages of the memory cells in different programming states will move simultaneously after the application of the programming pulse. When the threshold voltage of a memory cell reaches its target threshold voltage, a program inhibition condition may be applied to the memory cell, so that the threshold voltage of the memory cell reaching the target threshold voltage does not move again when a next programming pulse is applied. During the application of the next programming pulse, for memory cells of which the threshold voltages do not reach the target threshold voltage, the respective threshold voltages increase, and the respective threshold voltage distribution curves move towards a direction of a higher threshold voltage.

In some implementations, the threshold voltage range of the higher programming state may be predicted based on information obtained by programming verification for the lower programming state.

As shown in Sub-graphs (c), (d), and (e) of FIG. 1, in Sub-graph (c) of FIG. 1, when the highest programming state for performing the program verification is the second state, it may be predicted how many memory cells of which the target programming state is the third state can reach their target state after application of a next programming pulse, based on a verification result obtained by executing a program verification operation (PV2) for the second state.

For example, if among the memory cells of which the target state is the second state, only a very small number of memory cells or even no memory cells have reached the second state, it can be predicted that after the application of a next programming pulse, no memory cells of which the target programming state is the third state can reach the third state, that is, the third state would not be successfully programmed. Therefore, there is no need to start the program verification operation for the third state after the application of the next programming pulse. In this way, the number of programming states to be verified in the next program verification operation can be reduced, which is beneficial to shortening the program verification time, reducing the number of verification results to be processed, and improving the programming efficiency.

For another example, if among the memory cells of which the target state is the second state, many memory cells have reached the second state, it can be predicted that after application of a next programming pulse, there would be a memory cell of which the target programming state is the third state can reach the third state. Therefore, start the program verification operation for the third state after the application of a next programming pulse, so that occurrence of over-programming can be reduced, and the programming quality can be improved.

Figure 2:
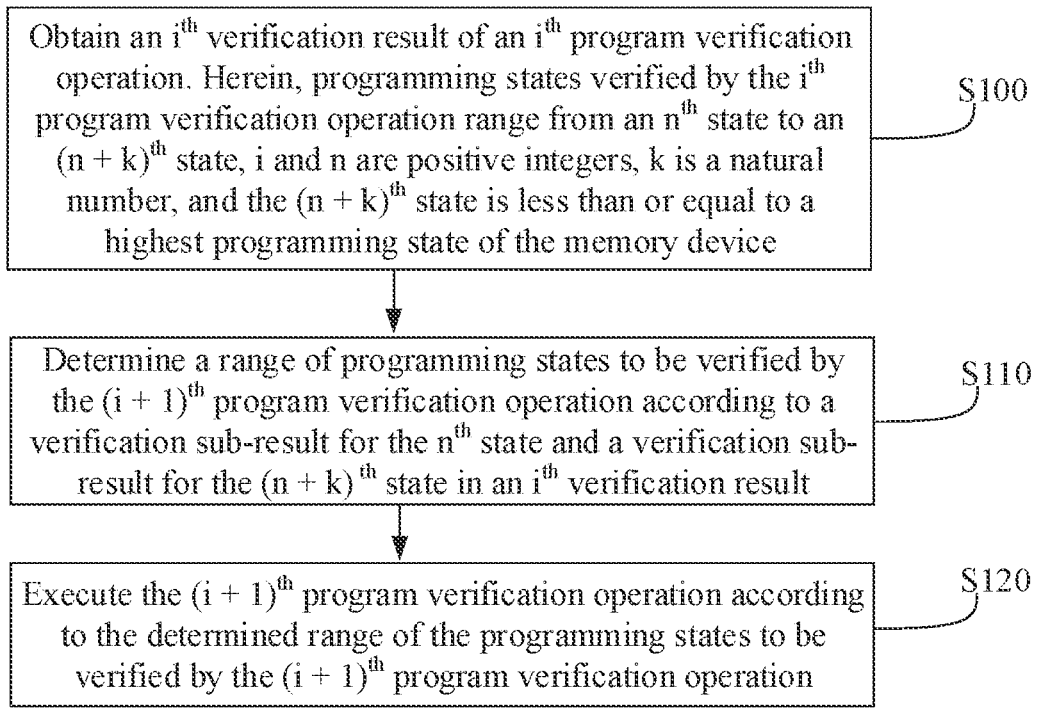
FIG. 2 is a flowchart of a program verification method shown according to an implementation of the present disclosure.

The present disclosure provides a program verification method for a memory device according to an implementation. Referring to FIG. 2, the program verification method comprises the following steps.

In S100, an $i^{th}$ verification result of an $i^{th}$ program verification operation is obtained. Herein, programming states verified by the $i^{th}$ program verification operation range from an $n^{th}$ state to an $(n+k)^{th}$ state, i and n are positive integers, k is a natural number, and the $(n+k)^{th}$ state is less than or equal to a highest programming state of the memory device.

In S110, a range of programming states to be verified by the $(i+1)^{th}$ program verification operation is determined according to a verification sub-result for the $n^{th}$ state and a verification sub-result for the $(n+k)^{th}$ state in an $i^{th}$ verification result.

In S120, the $(i+1)^{th}$ program verification operation is executed according to the determined range of the programming states to be verified by the $(i+1)_{th}$ program verification operation.

As an example, the memory device may include a memory array including a plurality of memory cells, and the memory cells may include single-stage cells (SLC), multi-level cells (MLC), third-level cells (TLC), fourth-level cells (QLC), or cells with a greater number of levels, etc.

In S100, the $i^{th}$ program verification operation can be understood as a program verification operation executed on to-be-programmed memory cells after the application of the $i^{th}$ programming pulse and before the application of the $(i+1)^{th}$ programming pulse starting from the erase state.

The range of the programming states verified by the $i^{th}$ program verification operation is from the $n^{th}$ state to the $(n+k)^{th}$ state, that is, the lowest state verified by the $i^{th}$ program verification operation is the $n^{th}$ state, and the highest state is the $(n+k)^{th}$ state, and the $i^{th}$ program verification operation needs to verify the states from the $n^{th}$ state to the $(n+k)^{th}$ state.

An $i^{th}$ verification result is used to indicate programming results of the to-be-programmed memory cells after the application of the $i^{th}$ programming pulses. The $i^{th}$ verification result may include at least one of the following: a first type of indication information indicating whether each of the verified memory cells has passed the programming; a second type of indication information indicating whether each of the verified memory cells has failed the programming; or a third type of indication information indicating the number of memory cells reaching the target programming state.

In S110, the verification sub-result for the $n^{th}$ state is used to represent a result obtained by performing program verification on the memory cells of which the target programming state is the $n^{th}$ state during the $i^{th}$ program verification operation. The verification sub-result for the $n^{th}$ state may include at least one of the following: a first type of indication information indicating whether each of the memory cells of which the target programming state is the $n^{th}$ state has passed the programming; a second type of indication information indicating whether each of the memory cells of which the target programming state is the $n^{th}$ state has failed the programming; or a third type of indication information indicating the number of the memory cells reaching the target programming state i.e., the $n^{th}$ state.

Similarly, the verification sub-result for the $(n+k)^{th}$ state is used to represent the result obtained by performing program verification on the memory cells of which the target programming state is the $(n+k)^{th}$ state during the $i^{th}$ program verification operation. The verification sub-result for the $(n+k)^{th}$ state may include at least one of the following: a first type of indication information indicating whether each of the memory cells of which the target programming state is the $(n+k)^{th}$ state has passed the programming; a second type of indication information indicating whether each of the memory cells of which the target programming state is the $(n+k)^{th}$ state has failed the programming; a third type of indication information indicating the number of the memory cells reaching the target programming state, i.e., the $(n+k)^{th}$ state.

In some implementations, the value of k may be equal to 0. When k is equal to 0, the value of n is equal to the value of n+k, that is, the $i^{th}$ program verification operation only performs program verification for the $n^{th}$ state.

Taking TLC as an example, the highest programming state of memory device is the $7^{th}$ state, so the value of n+k is less than or equal to 7. Taking QLC as an example, the highest programming state of memory device is the $15^{th}$ state, so the value of n+k is less than or equal to 15.

When performing program verification for different programming states, the initial verification levels are different from each other. In S110, determining the range of programming states to be verified by the $(i+1)^{th}$ program verification operation may include determining a verification level range for the $(i+1)^{th}$ program verification operation.

In some implementations, S110 includes the following operations.

A lowest programming state to be verified by the $(i+1)^{th}$ program verification operation is determined according to a verification sub-result for the $n^{th}$ state in the $i^{th}$ verification result.

A highest programming state to be verified by the $(i+1)^{th}$ program verification operation is determined according to a verification sub-result for the $(n+k)^{th}$ state in the $i^{th}$ verification result.

In S120, program verification is performed on all the memory cells of which the target state is within the range of the programming states to be verified by the $(i+1)^{th}$ program verification operation.

Alternatively, in S120, only the memory cells of which the target state is within the range of the programming states to be verified by the $(i+1)^{th}$ program verification operation and which are not successfully programmed in a previous programming are subjected to the $(i+1)^{th}$ program verification, so that the number of memory cells to be verified can be reduced and the time for the program verification can be shortened. In some implementations, the obtained $(i+1)^{th}$ verification result includes not only data indicating whether the memory cells performing the $(i+1)^{th}$ program verification have been successfully programmed, but also information indicating the number of memory cells that have been successfully programmed.

In some implementations, the $(i+1)^{th}$ program verification operation may be executed after the application of the $(i+1)^{th}$ programming pulse. In some implementations, the steps given in the above programming verification method can be repeated until the programming is completed, or until the maximum number of programming verifications is reached.

In the implementations of the present disclosure, after the application of the next programming pulse, a range of programming states to be verified by an $(i+1)^{th}$ program verification operation is determined according to the verification result of the $i^{th}$ program verification operation. That is, the range of programming states to be verified by the next program verification operation is determined according to the result of the previous program verification operation. The start loop of each programming state to be verified can be determined dynamically, thereby improving the accuracy of the determined start loop of each programming state to be verified. On one hand, it can reduce the increase of programming time due to a too-early start loop set for the program verification, which is beneficial to shortening the programming time; on the other hand, it can reduce the over-programming caused by a too-late start loop set for the program verification, which is beneficial to ensuring better programming quality.

In addition, the implementations of the present disclosure do not need to manually set a fixed start loop, instead, the range of programming states to be verified by each program verification operation is automatically determined by tracking differences of the memory programming performances through the verification result. The method is simple, and the range of programming states to be verified by the program verification operation can be adjusted in time according to the memory performance, which is beneficial to improving the programming quality.

In some implementations, the verification sub-result for the $n^{th}$ state of the $i^{th}$ verification result includes $i^{th}$ statistical data of the $n^{th}$ state for counting fail bits in programming for the $n^{th}$ state.

The operation of determining the lowest programming state to be verified by the $(i+1)^{th}$ program verification operation according to the verification sub-result for the $n^{th}$ state in the $i^{th}$ verification result includes the following actions.

The number of fail bits in programming for the $n^{th}$ state is determined according to the $i^{th}$ statistical data of the $n^{th}$ state.

When the number of fail bits in programming for the $n^{th}$ state is less than a first preset value, it is determined that the lowest programming state to be verified by the $(i+1)^{th}$ program verification operation is the $(n+1)^{th}$ state.

When the number of fail bits in programming for the $n^{th}$ state is greater than or equal to the first preset value, it is determined that the lowest programming state to be verified by the $(i+1)^{th}$ program verification operation is the $n^{th}$ state.

The $i^{th}$ statistical data of the $n^{th}$ state may include data indicating whether the $n^{th}$ program verification operation is passed for each memory cell of which the target programming state is the $n^{th}$ state. The number of fail bits in the $i^{th}$ programming operation for the $n^{th}$ state can be determined according to the $i^{th}$ statistical data of the $n^{th}$ state.

In some implementations, binary encoding may be employed to indicate whether a memory cell has passed programming. For example, 0 may indicate that the programming is passed and 1 may indicate that the programming is failed. Alternatively, 1 may indicate that the programming is passed and 0 may indicate that the programming is failed. In some implementations, it is feasible to select an appropriate way to indicate whether a memory cell has passed the programming according to the actual situation, and the implementations of the present disclosure are not limited in this regard.

When the number of fail bits in programming for the $n^{th}$ state is less than the first preset value, the programming for the $n^{th}$ state can be considered to be successfully completed, so that the program verification for the $n^{th}$ state does not need to be performed in the next program verification process. In this way, compared with the scheme that verification for the $n^{th}$ state is performed every time, the time for the program verification can be shortened and the programming speed can be improved.

When the number of fail bits in programming for the $n^{th}$ state is greater than or equal to the first preset value, it can be considered that the programming for the $n^{th}$ state has not been successful, so it needs to continue the program verification for the $n^{th}$ state in the next program verification process.

In some implementations, when a ratio of the number of fail bits in programming for the $n^{th}$ state to the number of bits for which the target state is the $n^{th}$ state is less than a first preset ratio, it is determined that the lowest programming state to be verified by the $(i+1)^{th}$ program verification operation is the $(n+1)^{th}$ state.

When the ratio of the number of fail bits in programming for the $n^{th}$ state to the number of bits for which the target state is the $n^{th}$ state is greater than or equal to the first preset ratio, it is determined that the lowest programming state to be verified by the $(i+1)^{th}$ program verification operation is the $n^{th}$ state.

Similarly, when the ratio of the number of fail bits in programming for the $n^{th}$ state to the number of bits for which the target state is the $n^{th}$ state is less than the first preset value, the programming for the $n^{th}$ state can be considered to be successfully completed, so that the program verification for the $n^{th}$ state does not need to be performed in the next program verification process. In this way, compared with the scheme that verification for the $n^{th}$ state is performed every time, the time for the program verification can be shortened and the programming speed can be improved.

When the ratio of the number of fail bits in programming for the $n^{th}$ state to the number of bits for which the target state is the $n^{th}$ state is greater than or equal to the first preset value, the programming for the $n^{th}$ state can be considered to be not yet successful, so that it should continue the program verification for the $n^{th}$ state in the next program verification process.

In some implementations, the method further includes the following operations.

A number of loops of the to-be-programmed memory cells is obtained.

A value range of the first preset value or a value range of the first preset ratio is determined according to the number of loops.

Performing one erase operation and one write operation on the memory device is called a loop. With the increase in the number of loops, the programming performance of the memory device may change, resulting in a change of the programming speed. It can be understood that, the loop is defined by a smallest programming unit. For example, when programming is executed in blocks, i.e., the block is the smallest unit, the numbers of loops of the memory cells in the block are basically the same.

When the memory device is programmed in different minimum units, the number of loops obtained is the number of loops of the minimum unit for which the programming is executed.

In the implementations of the present disclosure, by obtaining the number of loops of the to-be-programmed memory cells, and determining the first preset value according to the number of loops, the programming characteristics varying with the change of the number of loops can be tracked in the program verification process, and the range of the first preset value can be flexibly adjusted, thus alleviating the slow programming speed caused by improper determination of the first preset value, which is beneficial to improving the programming speed and ensuring better programming quality.

In some implementations, the value range of the first preset value is within an allowable range of an Error Correcting Code (ECC) error correction mechanism performed on the memory device.

In some implementations, in order to ensure the programming quality, it should stop the program verification operation for the $n^{th}$ state after the programming for the $n^{th}$ state is completed. Due to the existence of the ECC error correction mechanism, when the number of fail bits in the programming for the $n^{th}$ state is within the allowable range of the ECC error correction mechanism, at least partially fail bits can be corrected through the ECC error correction, so as to ensure that correct data can be read from the memory device.

In the implementation of the present disclosure, since the value range of the first preset value is within the allowable range of the ECC mechanism, when the number of fail bits in the programming for the $n^{th}$ state is less than the first preset value, the fail bits can be corrected through the ECC error correction mechanism, so as to ensure that the programming for the $n^{th}$ state can be successfully completed, and the $n^{th}$ state does not need to be verified in the next program verification, which is beneficial to reducing the number of programming states to be verified and improving the programming efficiency.

In some implementations, the first preset ratio ranges from 0.4% to 0.6%. For example, the value of the first preset ratio may be 0.5%.

In some implementations, the verification sub-result for the $(n+k)^{th}$ state in the $i^{th}$ verification result includes: $i^{th}$ statistical data of the $(n+k)^{th}$ state for counting successful bits in the programming for the $(n+k)^{th}$ state.

The operation of determining the highest programming state to be verified by the $(i+1)^{th}$ program verification operation according to the verification sub-result for the $(n+k)^{th}$ state in the $i^{th}$ verification result includes the following actions.

A number of successful bits in programming for the $(n+k)^{th}$ state is determined according to the $i^{th}$ statistical data of the $(n+k)^{th}$ state.

When the number of successful bits in programming for the $(n+k)^{th}$ state is larger than the second preset value, and the $(n+k)^{th}$ state is smaller than the highest programming state of the memory device, it is determined that the highest programming state to be verified by the $(i+1)^{th}$ program verification operation is the $(n+k+1)^{th}$ state.

When the number of successful bits in programming for the $(n+k)^{th}$ state is less than or equal to a second preset value, it is determined that the highest programming state to be verified by the $(i+1)^{th}$ program verification operation is the $(n+k)^{th}$ state.

The $i^{th}$ statistical data of the $(n+k)t^h$ state may include data indicating whether the $n^{th}$ program verification operation is passed for each memory cell of which the target state is the $(n+k)^{th}$ state. The number of fail bits in the $i^{th}$ programming operation for the $(n^{+k})^{th}$ state can be determined according to the $i^{th}$ statistical data of the $(n+k)^{th}$ state.

When the number of successful bits in the programming for the $(n+k)^{th}$ state is greater than the second preset value, and the $(n+k)^{th}$ state is less than the highest programming state of the memory device, it can be considered that after application of the next programming pulse, many memory cells of which the target programming state is the $(n+k)^{th}$ state may reach the target state, and there may be memory cells of which the target state is the $(n+k+1)^{th}$ state that would reach the target state. Therefore, in the next program verification process, it should perform program verification for the $(n+k+1)^{th}$ state to reduce the over-programming caused by the too-late start of the verification for the $(n+k+1)^{th}$ state.

When the number of successful bits in the programming for the $(n+k)^{th}$ state is less than or equal to the second preset value, it can be considered that the programming for the $(n+k)^{th}$ state has not been successful, and the probability that the memory cells of which the target state is the $(n+k+1)^{th}$ state reach the target state is very low after application of the next programming pulse. Therefore, in the next program verification process, there is no need to start verifying the $(n+k+1)^{th}$ state, and the highest programming state to be verified by the next program verification operation is still the $(n+k)^{th}$ state.

In some implementations, when a ratio of the number of successful bits in the programming for the $(n+k)^{th}$ state to the number of bits for which the target state is the $(n+k)^{th}$ state is greater than the second preset ratio, it is determined that the highest programming state to be verified by the $(i+1)^{th}$ program verification operation is the $(n+k+1)^{th}$ state;

When the ratio of the number of successful bits in the programming for the $(n+k)^{th}$ state to the number of bits for which the target state is the $(n+k)^{th}$ state is less than or equal to the second preset ratio, it is determined that the highest programming state to be verified by the $(i+1)^{th}$ program verification operation is the $(n+k)^{th}$ state.

Similarly, when the ratio of the number of successful bits in the programming for the $(n+k)^{th}$ state to the number of bits for which the target state is the $(n+k)^{th}$ state is greater than a second preset value, and the $(n+k)^{th}$ state is less than the highest programming state of the memory device, it can be considered that after application of the next programming pulse, there may be many memory cells of which target programming state is $(n+k)^{th}$ state that has reached the target state, and there may be memory cells of which the target state is $(n+k+1)^{th}$ state that have reached the target state. Therefore, in the next program verification process, it should start the program verification for the $(n+k+1)^{th}$ state, so as to reduce over-programming caused by the too-late start of the verification for $(n+k+1)^{th}$ state.

When the ratio of the number of successful bits in the programming for the $(n+k)^{th}$ state to the number of bits for which the target state is the $(n+k)^{th}$ state is less than or equal to the second preset value, it can be considered that the programming for the $(n+k)^{th}$ state has not been successful, and after application of the next programming pulse, the probability that the memory cells of which the target state is the $(n+k+1)^{th}$ state reach the target state is very low. Therefore, in the next program verification process, there is no need to verify the $(n+k+1)^{th}$ state, and the highest state to be verified by the next program verification operation is still the $(n+k)^{th}$ state.

In some implementations, the method further includes the following operations.

The number of loops of the to-be-programmed memory cells is acquired.

The value range of the second preset value or the value range of the second preset ratio is determined according to the number of loops.

In the implementations of the present disclosure, by obtaining the number of loops of the to-be-programmed memory cells, the second preset value is determined according to the number of loops, so that the programming characteristics varying with change of the number of loops can be tracked in the program verification process, and the range of the second preset value can be flexibly adjusted, thus alleviating the slow programming speed caused by improper setting of the second preset value, which is beneficial to improving the programming speed and ensuring better programming quality.

In some implementations, the second preset ratio ranges from 2% to 3%. For example, the second preset ratio may be 2.3%.

In some implementations, based on the concept of Program Vt distribution sigma (PVS), taking TLC as an example, each programming pulse will move the threshold voltage distribution by about 2 times sigma, and the difference between verification levels of different programming states is about 3 times sigma. In order to avoid over-programming from occurring for the memory cells of which the target programming state is the $(n+k+1)^{th}$ state after application of the next programming pulse, resulting in the threshold voltage of the memory cells exceeding the target threshold voltage, the value of the second preset value can be set to exceed 2 times of sigma (i.e. 2.3%).

When the ratio of the number of successful bits in the programming for the $(n+k)^{th}$ state to the number of bits for which the target state is the $(n+k)^{th}$ state is more than 2.3%, it can be considered that after application of the next programming pulse, there may be many (for example, 50%) memory cells of which the target programming state is $(n+k)^{th}$ state that would reach the target state. Moreover, because the target threshold voltage of the $(n+k+1)^{th}$ state is distributed at negative 3 times sigma, there may be the memory cells of which the target state is the $(n+k+1)^{th}$ state that reach the target threshold voltage. Therefore, it should start verifying the $(n+k+1)^{th}$ state in the next program verification.

In some implementations, the program verification method is applied to an incremental step pulse programming method, the program verification method further includes the following operations.

A step and/or a programming voltage slope of the incremental step pulse programming is obtained.

A value range of the second preset value is determined according to the step and/or the programming voltage slope; or a value range of the second preset ratio is determined according to the step and the programming voltage slope.

As an example, the memory device may be programmed in an Incremental Step Pulse Programming (ISPP) manner. It should be pointed out that when the step and/or the programming voltage slope changes, the change speed of the threshold voltage of a memory cell would also change, so the value ranges of the second preset value and the second preset ratio can be adjusted correspondingly.

Taking the step as an example, when the step is large, the threshold voltage of the memory cell is greatly increased after the application of each programming pulse, so that the values of the second preset value and the second preset ratio may be relatively small. When the step is small, the threshold voltage of the memory cell is slightly increased after the application of each programming pulse, so that the values of the second preset value and the second preset ratio can be relatively large.

For example, taking QLC as an example, coarse programming or fine programming can be adopted, and the step of coarse programming is larger than that of fine programming. Therefore, the value of the second preset value when coarse programming is adopted is smaller than that when fine programming is adopted. Or the value of the second preset ratio when the coarse programming is adopted is smaller than the value of the second preset ratio when the fine programming is adopted.

In the implementations of the present disclosure, the step and/or the programming voltage slope of the incremental step pulse programming is obtained, and the value range of the second preset value is determined according to the step and/or the programming voltage slope; or, the value range of the second preset ratio is determined according to the step and/or the programming voltage slope. In this way, the value range of the second preset value and the value range of the second preset ratio can be flexibly adjusted, and the slow programming speed caused by improper setting of the second preset value and the second preset ratio can be reduced, thus improving the programming speed, and reducing the programming quality.

In some implementations, S110 includes the following operations.

A verification sub-result of the $n^{th}$ state and a verification sub-result of the $(n+k)^{th}$ state in the $i^{th}$ verification result are sampled respectively to obtain the $i^{th}$ sampling statistical data of the $n^{th}$ state and the $i^{th}$ sampling statistical data of the $(n+k)^{th}$ state.

The lowest programming state to be verified by the $(i+1)^{th}$ program verification operation is determined according to the $i^{th}$ sampling statistical data of the $n^{th}$ state.

The highest programming state to be verified by the $(i+1)^{th}$ program verification operation is determined according to the $i^{th}$ sampling statistical data of the $(n+k)^{th}$ state.

During the program verification operation, the generated verification result can be registered in a page buffer, and these data can be used to determine the memory cells that need to apply the program inhibition voltage during subsequent application of the programming pulse. In particular, the verification result may be registered in a specific latch in the page buffer, which is only used to temporarily store the verification result of the program verification operation. Alternatively, the verification results may be registered in some other latches in the page buffer, which may also be used to store program data, program inhibition information, or the like.

The $i^{th}$ sampling statistical data of the $n^{th}$ state may include statistical data obtained by randomly sampling the verification results of all memory cells of which the target programming state is the $n^{th}$ state, and counting the fail bits in the sampling results.

The i-sampling statistic data of the $(n+k)^{th}$ state may include statistical data obtained by randomly sampling the verification results of all memory cells of which the target programming state is the $(n+k)^{th}$ state and counting the fail bits in the sampling results.

As an example, when there are 16 KB latches in the page buffer for storing the above verification results, the verification results stored by 4 KB of the latches may be randomly selected as sampling data to determine the lowest programming state and the highest programming state to be verified by the $(i+1)^{th}$ program verification operation.

In some implementations, data stored in 2 KB or 8 KB of the latches may also be randomly selected as sampling data to determine the lowest and highest programming states to be verified by the $(i+1)^{th}$ program verification operation.

In some implementations, when sampling the fail bit count data to obtain the $i^{th}$ sampling statistical data of the $n^{th}$ state and the $i^{th}$ sampling statistical data of the $(n+k)^{th}$ state, it is not limited to obtaining data in a unit of an entire latch, but also can obtain only part of the data in a certain latch as sampling statistical data.

After each program verification operation, the generated verification result includes a large amount of data, especially when program verification is performed for each to-be-programmed memory cell. Therefore, if the verification results of all memory cells are counted, the time to count the fail bits is prolonged, resulting in an increase in the programming time.

In the implementation of the present disclosure, by sampling the verification result of the $n^{th}$ state and the verification result of the $(n+k)^{th}$ state respectively, the $i^{th}$ sampling statistical data of the $n^{th}$ state and the $i^{th}$ sampling statistical data of the $(n+k)^{th}$ state are obtained, the lowest programming state to be verified by the $(i+1)^{th}$ program verification operation is determined according to the $i^{th}$ sampling statistical data of the $n^{th}$ state, the highest programming state to be verified by the $(i+1)^{th}$ program verification operation is determined according to the $i^{th}$ sampling statistical data of the $(n+k)^{th}$ state, which can reduce the total amount of data for each fail bit count, is beneficial to shorten the time for fail bit count, improves the determined range of programming states to be verified by the $(i+1)^{th}$ program verification operation, and further improves the programming speed, shortens the programming time and improves the memory performance.

In some implementations, the programming of a memory device is typically executed by using the following iterative process: applying a programming pulse to memory cells, verifying whether the memory cells have reached a desired data state (i.e., a target programming state) in response to the programming pulse, and repeating the iterative process until the memory cells have passed the program verification. When a memory cell passes the verification, further programming is prohibited, but other memory cells that have not reached the target programming state can still be programmed for subsequent programming pulses.

After each verification operation, it should count the memory cells that fail the verification in the programming operation, that is, performing Fail Bit Count (FBC). In time sequence, the FBC operation is executed between the current programming operation and the next programming operation, which takes extra time and leads to a long programming time.

Figure 3:
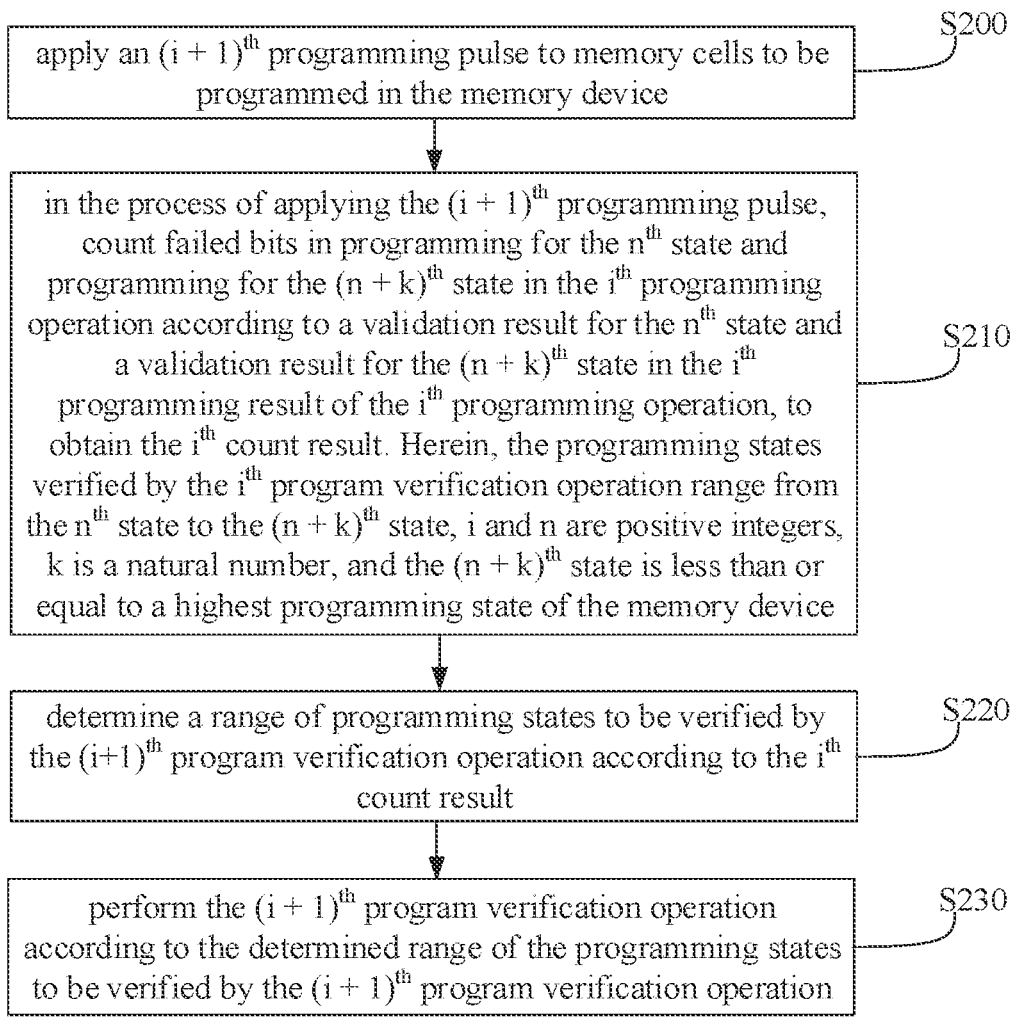
FIG. 3 is a flowchart of a programming method shown according to an implementation of the present disclosure.

In view of this, FIG. 3 is a flowchart of a method for programming a memory device according to an implementation. Referring to FIG. 3, the programming method includes the following steps.

In S200, an $(i+1)^{th}$ programming pulse is applied to to-be-programmed memory cells in the memory.

In S210, in the process of applying the $(i+1)^{th}$ programming pulse, the fail bits in the programming for the $n^{th}$ state and in the programming for the n+k state in the $i^{th}$ programming operation are counted according to the verification result for the $n^{th}$ state and the verification result for the $(n+k)^{th}$ state in the $i^{th}$ programming result of the $i^{th}$ programming operation, to obtain the $i^{th}$ count result. Herein, the programming states verified by the $i^{th}$ program verification operation range from the $n^{th}$ state to the $(n+k)^{th}$ state, i and n are positive integers, k is a natural number, and the $(n+k)^{th}$ state is less than or equal to the highest programming state of the memory device.

In S220, a range of programming states to be verified by the $(i+1)^{th}$ program verification operation is determined according to the $i^{th}$ count result.

In S230, the $(i+1)^{th}$ program verification operation is executed according to the determined range of the programming states to be verified by the $(i+1)^{th}$ program verification operation.

In S200, a programming pulse application operation may be executed on the memory cell array by a programming operation circuit in a peripheral circuit of the memory device, to control a voltage level of a selected bit line of the memory cell array.

In S210, the process of the $(i+1)^{th}$ programming pulse may include an $(i+1)^{th}$ programming preparation operation stage and an $(i+1)^{th}$ programming stabilization execution stage. Herein, the $(i+1)^{th}$ programming preparation operation is an operation for preparing the state and data related to the $(i+1)^{th}$ programming operation, corresponding to a stage in which an $(i+1)^{th}$ pass voltage (Vpass) is applied to a selected word line in voltage timing; and the $(i+1)^{th}$ programming stabilization execution stage is a stage in which a voltage level of a bit line of a memory cell array is controlled in response to programming data during the programming pulse application operation, and an $(i+1)^{th}$ programming voltage is applied to the selected word line in the voltage timing.

In some implementations, the $i^{th}$ statistical data may be read at the $(i+1)^{th}$ programming stabilization execution phase after the $(i+1)^{th}$ programming preparation operation, i.e. after the $(i+1)^{th}$ pass voltage is applied to the selected word line.

In S220, the $i^{th}$ count result may include the $i^{th}$ statistical data of the $n^{th}$ state and the $i^{th}$ statistical data of the $(n+k)^{th}$ state in the program verification method described above. Alternatively, the $i^{th}$ count result may include the $i^{th}$ sampling statistical data in the above-mentioned program verification method, so that the range of programming states to be verified by the $(i+1)^{th}$ program verification operation is determined according to the $i^{th}$ count result, which may be referred to the program verification method according to the implementation of the present disclosure and will not be described here.

The programming method according to the implementation of the present disclosure may count, in the process of applying the $(i+1)^{th}$ programming pulse, fail bits in the programming result for the $n^{th}$ state and the programming result for the $(n+k)^{th}$ state respectively according to the verification result for the $n^{th}$ state and the verification result for the $(n+k)^{th}$ state in the $i^{th}$ verification result of the $i^{th}$ program verification operation, to determine the range of programming state ranges to be verified by the $(i+1)^{th}$ program verification operation. Therefore, the FBC operation in the iterative process of the whole programming operation does not occupy extra time, thereby saving the time for performing the iterative process of the whole programming operation and improving the programming efficiency of the memory cells.

In addition, the implementation of the present disclosure can save logic overhead by hiding the FBC process in the process of applying programming pulses.

In some implementations, S220 may be executed between S210 and S230 in time sequence.

In some implementations, S220 may overlap with S210 in time sequence. S220 may be executed during the application of the $(i+1)^{th}$ programming pulse and after the $i^{th}$ count result is obtained. In this way, the range of programming states to be verified for determining the $(i+1)^{th}$ program verification operation can be hidden in the process of applying the $(i+1)^{th}$ programming pulse, Thus, in the iterative process of the whole programming operation, the operation of determining the range of programming states to be verified by the $(i+1)^{th}$ program verification operation does not occupy extra time, thereby further saving the time for performing the iterative process of the whole programming operation and improving the programming efficiency of the memory cells.

In some implementations, the $i^{th}$ count result includes the number of fail bits in the programming for the $n^{th}$ state in the $i^{th}$ programming operation.

S220 may include the following operations.

When the number of fail bits in the programming for the $n^{th}$ state is less than a first preset value, it is determined that a lowest programming state to be verified by the $(i+1)^{th}$ program verification operation is the $(n+1)^{th}$ state.

When the number of fail bits in the programming for the $n^{th}$ state is greater than or equal to the first preset value, it is determined that the lowest programming state to be verified by the $(i+1)^{th}$ program verification operation is the $n^{th}$ state.

In some implementations, S220 may include the following operations.

When a ratio of the number of fail bits in the programming for the $n^{th}$ state to the number of bits of which the target state is the $n^{th}$ state is less than a first preset ratio, it is determined that a lowest programming state to be verified by the $(i+1)^{th}$ program verification operation is the $(n+1)^{th}$ state.

When the ratio of the number of fail bits in the programming for the $n^{th}$ state to the number of bits of which the target state is the $n^{th}$ state is greater than or equal to the first preset ratio, it is determined that the lowest programming state to be verified by the $(i+1)^{th}$ program verification operation is the $n^{th}$ state.

In some implementations, the $i^{th}$ count result includes the number of fail bits in the programming for the $(n+k)^{th}$ state in the $i^{th}$ programming operation.

S220 may include the following operations.

When the number of successful bits in the programming for the $(n+k)^{th}$ state is larger than a second preset value, and the $(n+k)^{th}$ state is smaller than the highest programming state of the memory device, it is determined that a highest programming state to be verified by the $(i+1)^{th}$ program verification operation is the $(n+k+1)^{th}$ state;

When the number of successful bits in the programming for the $(n+k)^{th}$ state is less than or equal to the second preset value, it is determined that the highest programming state to be verified by the $(i+1)^{th}$ program verification operation is the $(n+k)^{th}$ state.

In some implementations, S220 may include the following operations.

When a ratio of the number of successful bits in the programming for the $(n+k)^{th}$ state to the number of bits of which the target state is the $(n+k)^{th}$ state is greater than the second preset ratio, it is determined that the highest programming state to be verified by the $(i+1)^{th}$ program verification operation is the $(n+k+1)t^h$ state.

When the ratio of the number of successful bits in the programming for the $(n+k)^{th}$ state to the number of bits of which the target state is the $(n+k)^{th}$ state is less than or equal to the second preset ratio, it is determined that the highest programming state to be verified by the $(i+1)^{th}$ program verification operation is the $(n+k)^{th}$ state.

In some implementations, S210 may include the following operations.

The verification sub-result of the nth state and the verification sub-result of the $(n+k)^{th}$ state in the $i^{th}$ verification result are sampled respectively to obtain the $i^{th}$ sampling data of the $n^{th}$ state and the $i^{th}$ sampling data of the $(n+k)^{th}$ state.

The fail bits in the programming for the $n^{th}$ state and in the programming for the $(n+k)^{th}$ state in the $i^{th}$ programming operation are counted according to the $i^{th}$ sampling data of the $n^{th}$ state and the $i^{th}$ sampling data of the $(n+k)^{th}$ state, to obtain the $i^{th}$ count result.

The $i^{th}$ count result may include $i^{th}$ sample statistical data of the $n^{th}$ state and $i^{th}$ sample statistical data of the $(n+k)^{th}$ state.

As an example, the verification results of all memory cells of which the target programming state is the $n^{th}$ state may be randomly sampled to obtain the $i^{th}$ sample sampling data of the $n^{th}$ state, and then fail bits in the $i^{th}$ sampling data of the $n^{th}$ state are counted to obtain the $i^{th}$ sample statistical data of the $n^{th}$ state.

Similarly, the verification results of all memory cells of which the target programming state is the $(n+k)^{th}$ state can be randomly sampled to obtain the $i^{th}$ sampling data of the $(n+k)^{th}$ state, and then fail bits in the $i^{th}$ sampling data of the $(n+k)^{th}$ state can be counted to obtain the $i^{th}$ sample statistical data of the $(n+k)^{th}$ state.

In the implementation of the present disclosure, the $it^h$ sampling data of the $n^{th}$ state and the $i^{th}$ sampling data of the $(n+k)^{th}$ state are obtained by sampling the verification result of the $n^{th}$ state and the verification result of the $(n+k)^{th}$ state respectively, and the $i^{th}$ count result is obtained according to the $i^{th}$ sampling data of the nth state and the $i^{th}$ sampling data of the $(n+k)^{th}$ state. In this way, the total amount of data for each FBC can be reduced, the time for the FBC can be shortened, the determined range of programming states to be verified by the $(i+1)^{th}$ program verification operation can be improved, thus increasing the programming speed, shortening the programming time and improving the performance of the memory device.

Figure 4:
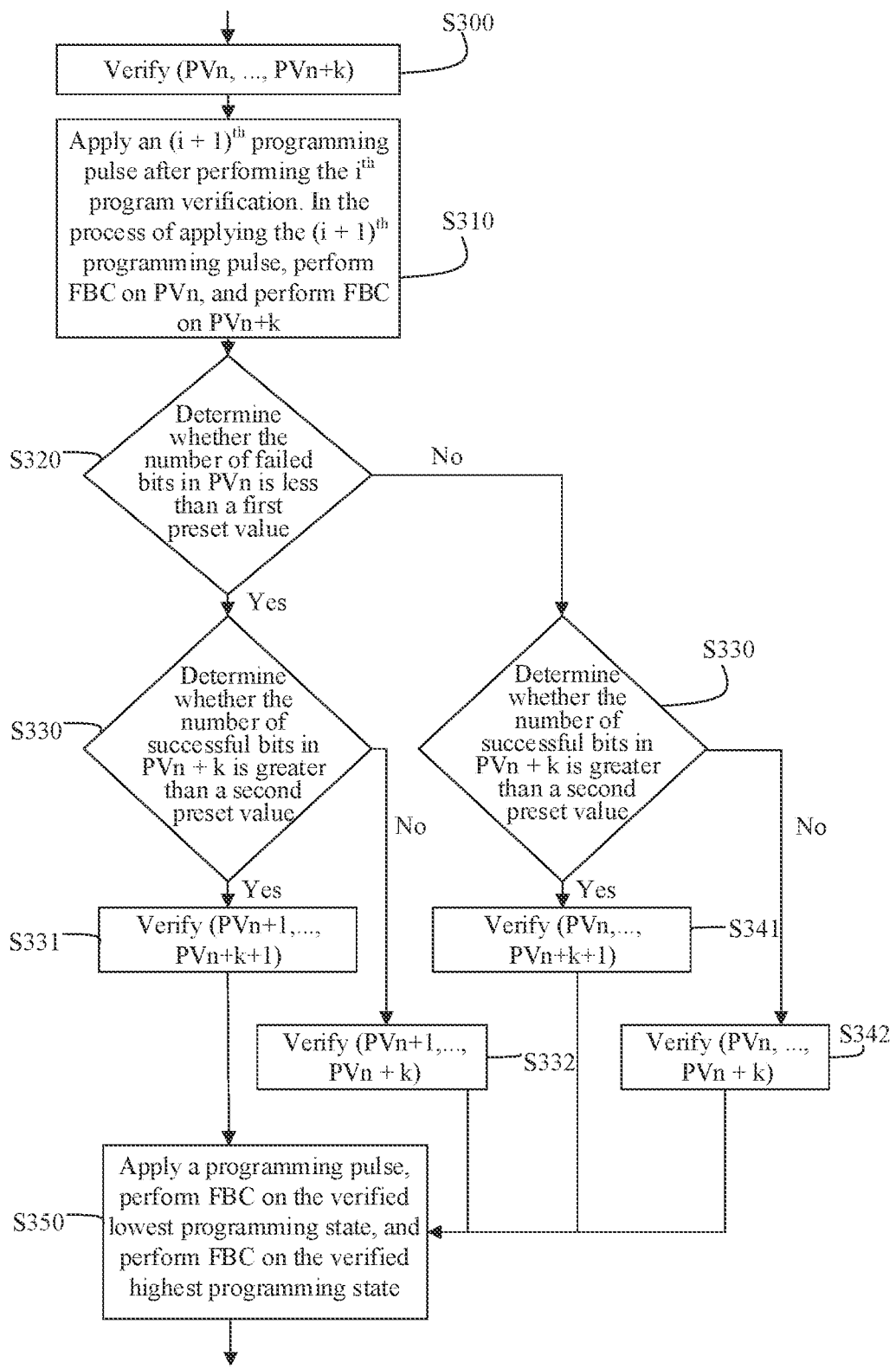
FIG. 4 is a partial flow diagram of a programming method shown according to an implementation of the present disclosure.

Referring to FIG. 4, taking TLC as an example, a partial flow chart of executing a programming operation on a three-dimensional NAND memory is shown. The programming method includes the following steps.

In S300, an $i^{th}$ program verification is performed to perform program verification (i.e. verifying (PVN, . . . , PV(n+k))) on memory cells of which the target states are the $n^{th}$ to $(n+k)^{th}$ states. Herein, i and n are positive integers, k is a natural number, and the $(n+k)^{th}$ state is less than or equal to the highest programming state of the memory device.

In S310, an $(i+1)^{th}$ programming pulse is applied after performing the $i^{th}$ program verification. In the process of applying the $(i+1)^{th}$ programming pulse, FBC is executed on the programming for the $n^{th}$ state and the programming for the $(n+k)^{th}$ state in the $i^{th}$ programming operation according to the verification sub-result for the $n^{th}$ state and the verification sub-result for the $(n+k)^{th}$ state in the $i^{th}$ program verification result of the $i^{th}$ program verification operation, to obtain the $i^{th}$ count result.

In S320, it is determined whether the number of fail bits in the program verification (i.e., PVn) for the $n^{th}$ state is less than a first preset value according to the $i^{th}$ count result.

In S330, it is determined whether the number of successful bits in the program verification (i.e. PVn+k) for the $(n+k)^{th}$ state is greater than a second preset value according to the $i^{th}$ count result.

When the number of fail bits in the program verification (i.e. PVn) for the $n^{th}$ state is smaller than the first preset value, and the number of successful bits in the program verification (i.e. PVn+k) for the $(n+k)^{th}$ state is larger than the second preset value, it can be determined that the range of programming states to be verified by the $(i+1)^{th}$ program verification operation is from the $(n+1)^{th}$ state to the $(n+k+1)^{th}$ state, so that the process jumps to S331.

When the number of fail bits in the program verification (i.e., PVn) for the $n^{th}$ state is smaller than the first preset value, and the number of successful bits in the program verification (i.e. PVn+k) for the $(n+k)^{th}$ state is smaller than or equal to the second preset value, it can be determined that the range of programming states to be verified by the $(i+1)^{th}$ program verification operation is from the $(n+1)^{th}$ state to the $(n+k)^{th}$ state, so that the process jumps to S332.

When the number of fail bits in the program verification (i.e., PVn) for the $n^{th}$ state is greater than or equal to the first preset value, and the number of successful bits in the program verification (i.e. PVn+k) for the $(n+k)^{th}$ state is greater than the second preset value, it can be determined that the range of programming states to be verified by the $(i+1)^{th}$ program verification operation is from the $n^{th}$ state to the $(n+k+1)^{th}$ state, so that the process jumps to S341.

When the number of fail bits in the program verification (i.e., PVN) for the nth state is greater than or equal to the first preset value, and the number of successful bits in the program verification (i.e. PVn+k) for the $(n+k)^{th}$ state is less than or equal to the second preset value, it can be determined that the range of programming states to be verified by the $(i+1)^{th}$ program verification operation is from the $n^{th}$ state to the $(n+k)^{th}$ state, so that the process jumps to S342.

In S331, an $(i+1)^{th}$ program verification is performed to perform program verification (i.e. verifying (PVn+1, . . . , PVn+k+1)) on the memory cells of which target states are $(n+1)^{th}$ to $(n+k+1)^{th}$ states. Herein, the $(n+k+1)^{th}$ state is less than or equal to the highest programming state of the memory device.

In S332, an $(i+1)^{th}$ program verification is performed to perform program verification (i.e. verifying (PVn+1, . . . , PVn+k)) on memory cells of which target states are $(n+1)^{th}$ to $(n+k)^{th}$ states.

In S341, an $(i+1)^{th}$ program verification is performed to perform program verification (i.e. verifying (PVn, . . . , PVn+k+1)) on memory cells of which target states are the $n^{th}$ state to the $(n+k+1)^{th}$ state. Herein, the $(n+k+1)^{th}$ state is less than or equal to the highest programming state of the memory device.

In S342, an $(i+1)^{th}$ program verification is performed to perform program verification (i.e. verifying (PVN, . . . , PVn+k)) on memory cells of which target states are the $n^{th}$ state to the $(n+k)^{th}$ state.

In S350, after completing the $(i+1)^{th}$ programming verification, a programming pulse is applied, and in the process of applying the programming pulse, fail bits in the programming for the lowest state and in the programming for the highest state in the $(i+1)^{th}$ programming operation are counted respectively according to the verification result for the lowest state and the verification result for the highest state in the $(i+1)^{th}$ verification result of the $(i+1)^{th}$ program verification operation, to obtain the $(i+1)^{th}$ count result.

Each time the program verification is performed, the highest state of the verification should be less than or equal to the highest state to which the memory device can be programmed. When the highest state of the next program verification determined according to S330 is larger than the highest state to which the memory device can be programmed, the highest state of the next program verification is still the highest state to which the memory device can be programmed.

Taking TLC as an example, the highest state that can be programmed to is L7, so when the highest state of the $i^{th}$ program verification operation is L7, and the number of successful bits of PV7 is greater than the second preset value, the highest state of the $(i+1)^{th}$ program verification operation is still L7.

Taking TLC as an example, when the value of i is 4, the value of n is 1, and the value of k is 1, the method includes the following steps.

In Step 1, a fourth program verification operation (i.e., S300) is executed. The verification state range of the fourth program verification operation is from the first state to the second state, and a threshold voltage distribution curve as shown in (d) of FIG. 1 is obtained.

In Step 2, after performing the fourth program verification, a fifth programming pulse is applied, and when the fifth programming pulse is applied, the fail bits in the programming for the first state and in the programming for the second state in the fourth programming operation are counted respectively according to the verification sub-result for the lowest state (i.e., the first state) and the verification sub-result for the highest state (i.e., the second state) in the verification result of the fourth program verification operation, to obtain the fourth count result (i.e., S310 is executed for the first time);

Then, the range of the programming states to be verified by the fifth program verification operation is determined according to the fourth count result. For example, the third step can be executed: it is judged whether the number of fail bits in the program verification for the first state in the fourth program verification operation is less than a first preset value according to the fourth count result (that is, executing S320). It is judged whether the number of successful bits in the program verification for the second state is larger than the second preset value according to the fourth count result (that is, executing S330).

In Step 4, when the fourth count result indicates that in the fourth program verification operation, the number of fail bits in the program verification of the first state is less than the first preset value, and the number of successful bits in the program verification of the second state is greater than the second preset value, the process jumps to Step 5 (that is, executing S331).

When the fourth count result indicates that in the fourth program verification operation, the number of fail bits in the program verification for the first state is less than the first preset value, and the number of successful bits in the program verification for the second state is less than or equal to the second preset value, the process jumps to Step 6 (that is, executing S332).

When the fourth count result indicates that in the fourth program verification operation, the number of fail bits in the program verification for the first state is greater than or equal to the first preset value, and the number of successful bits in the program verification for the second state is greater than the second preset value, the process jumps to Step 7 (that is, executing S341).

When the fourth count result indicates that in the fourth program verification operation, the number of fail bits in the program verification for the first state is greater than or equal to the first preset value, and the number of passed bits in the program verification for the second state is less than or equal to the second preset value, the process jumps to Step 8 (that is, executing S342).

In Step 5, a fifth program verification operation is executed, herein the target states to be verified by the fifth program verification operation range from the second state to the third state, and then Step 9 is executed.

In Step 6, a fifth program verification operation is executed, herein the target state to be verified by the fifth program verification operation is the second state, and then Step 9 is executed.

In Step 7, a fifth program verification operation is executed, herein the target states to be verified by the fifth program verification operation range from the first state to the third state, and then Step 9 is executed.

In Step 8, a fifth program verification operation is executed, herein the target states to be verified by the fifth program verification operation range from the first state to the second state, and then Step 9 is executed.

In Step 9, a sixth programming pulse is applied; when the sixth programming pulse is applied, the fail bits are counted for the lowest programming state verified by the fifth program verification operation, and the fail bits are counted for the highest programming state verified by the fifth program verification operation, to obtain a fifth count result (i.e., executing S350).

During the programming operation, the above programming method can be executed in loops until the programming is completed, until the number of times for application of programming pulses reaches a maximum number, or until the number of program verifications reaches a maximum value.

Figure 5:
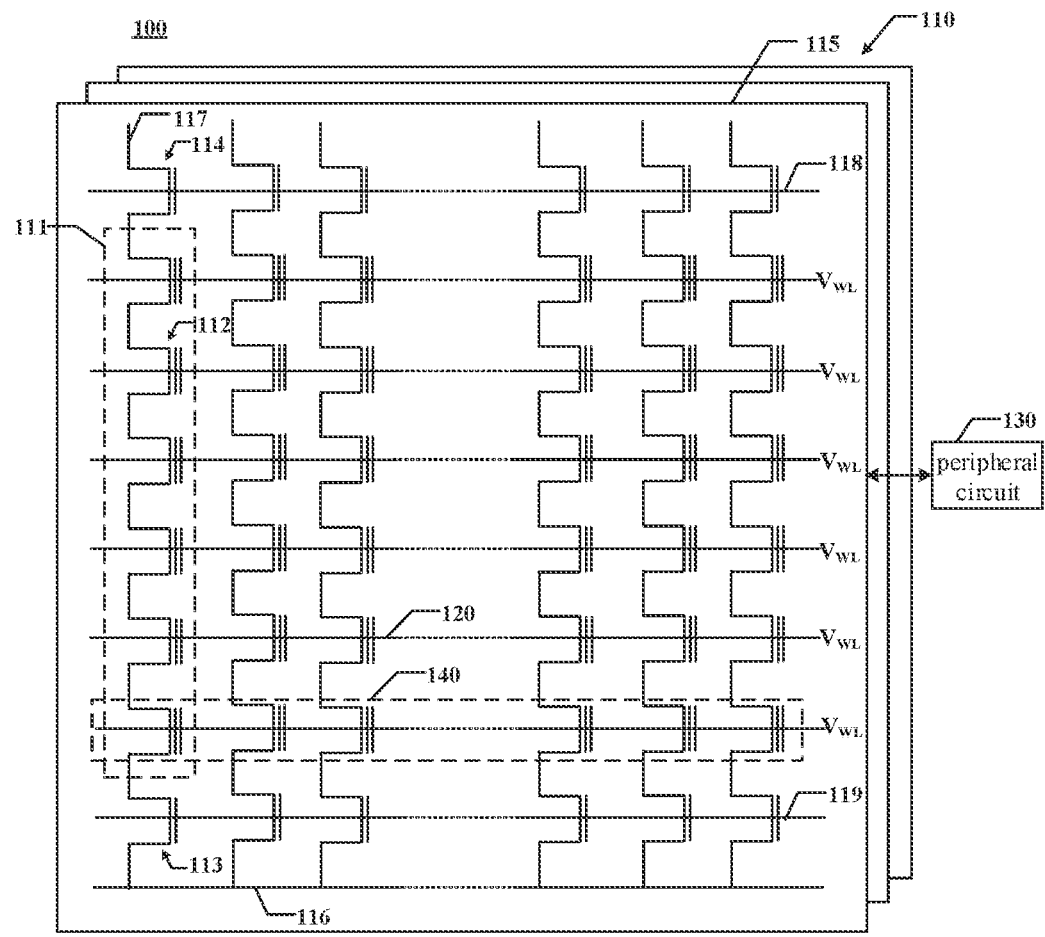
FIG. 5 is a schematic diagram of a memory device shown according to an implementation of the present disclosure.

FIG. 5 is a schematic diagram of a memory device 100 shown according to an implementation. Referring to FIG. 5, the memory device 100 includes a memory cell array 110, a plurality of word lines 120, and a peripheral circuit 130.

The memory cell array 110 includes a plurality of memory cell rows.

The plurality of word lines 120 are coupled to a plurality of memory cell rows, respectively.

The peripheral circuit 130 is coupled to the plurality of word lines 120 and configured to execute the program verification operation on a selected memory cell row, the selected memory cell row is coupled to the selected word line, wherein in order to execute the program verification operation, the peripheral circuit 130 is configured to:

obtain the $i^{th}$ verification result of the $i^{th}$ program verification operation; herein, the programming states verified by the $i^{th}$ program verification operation range from the nth state to the $(n+k)^{th}$ state, i and n are positive integers, k is a natural number, and the $(n+k)^{th}$ state is less than or equal to the highest programming state of the memory device;

determine a range of programming states to be verified by the $(i+1)^{th}$ program verification operation according to the verification sub-result for the $n^{th}$ state and the verification sub-result for the $(n+k)^{th}$ state in the $i^{th}$ verification result; and execute the $(i+1)^{th}$ program verification operation according to the determined range of the programming states to be verified by the (i+1)th program verification operation.

The memory cell array 110 may be a NAND flash memory cell array, herein the memory cell array 110 is provided in the form of an array of NAND memory strings 111, each extending vertically above a substrate (not shown). In some implementations, each NAND memory string 111 includes a plurality of memory cells 112 coupled in series and stacked vertically. Each memory cell 112 may maintain a continuous analog value, such as voltage or charge, depending on the number of electrons trapped within the region of the memory cell 112. Each memory cell 112 may be a floating-gate-type memory cell including a floating gate transistor or a charge-trapping-type memory cell including a charge trapping transistor.

In some implementations, each memory cell 112 is a single level cell having two possible memory states and thus may store one bit of data. For example, a first memory state "0" may correspond to a first voltage range and a second memory state "1" may correspond to a second voltage range.

In some implementations, each memory cell 112 is a cell capable of storing more than a single bit of data in more than four memory states. For example, each cell may store two bits (also known as a two-level cell), each cell may store three bits (also known as a three-level cell), or each cell may store four bits (also known as a four-level cell). Each MLC can be programmed to take a range of possible nominal stored values. In one example, if each MLC stores two digits of data, the MLC may be programmed to take one of three possible programming levels starting from the erase state by writing one of the possible nominal stored values to the cell. The fourth nominal stored value may be used for the erase state.

As shown in FIG. 5, each NAND memory string 111 may include a source selection gate (SSG) 113 at its source terminal and a drain selection gate (DSG) 114 at its drain terminal. The source selection gate 113 and drain selection gate 114 may be configured to activate a selected NAND memory string 111 (a column of the array) during read and program operations.

In some implementations, the sources of NAND memory string 111 in the same block 115 are coupled by the same source line (SL) 116 (e.g., common SL). In other words, according to some implementations, all NAND memory strings 111 in the same block 115 have an array common source (ACS).

According to some implementations, the drain selection gate 114 of each NAND memory string 111 is coupled to a respective bit line 117, from which data can be read or written via an output bus (not shown).

In some implementations, each NAND memory string 111 is configured to apply a selected voltage (e.g., higher than a threshold voltage of a transistor having a drain selection gate 114) or a deselected voltage (e.g., 0V) to a respective drain selection gate 114 via one or more DSG lines 118. In addition, and/or alternatively, in some implementations, each NAND memory string 111 is configured to apply a selected voltage (e.g., higher than a threshold voltage of a transistor having a source selection gate 113) or a deselected voltage (e.g., 0V) to a respective source selection gate 113 via one or more SSG lines 119.

As shown in FIG. 5, the NAND memory string 111 may be organized into a plurality of blocks 115, each of which may have a common source line 116 (e.g., coupled to ground). In some implementations, each block 115 is a basic data unit for an erase operation i.e., all memory cells 112 on the same block 115 are erased simultaneously. To erase memory cells 112 in a selected block, source lines coupled to the selected block and unselected blocks in the same plane as the selected block may be biased with an erase voltage (Vers) (e.g., high positive voltage (e.g., 20V or higher)).

In some examples, the erase operation may be executed at a half-block level, at a quarter-block level or at a level having any suitable number of blocks or any suitable fraction of blocks. Memory cells 112 of adjacent NAND memory strings 111 may be coupled by word lines 120 that select which row of the memory cells 112 is affected by read and program operations.

In some implementations, each word line 120 is coupled to a page 140 of memory cell 112, which is a basic data unit for programming operations. The size of a page 140 in bits may be related to the number of NAND memory strings 111 in a block 115 coupled by the word line 120. Each word line 120 may include a plurality of control gates (gate electrodes) at each memory cell 112 in a respective page 140 and gate lines coupled to the control gates. A memory cell row is a plurality of memory cells 112 located on the same page 140.

Figure 6:
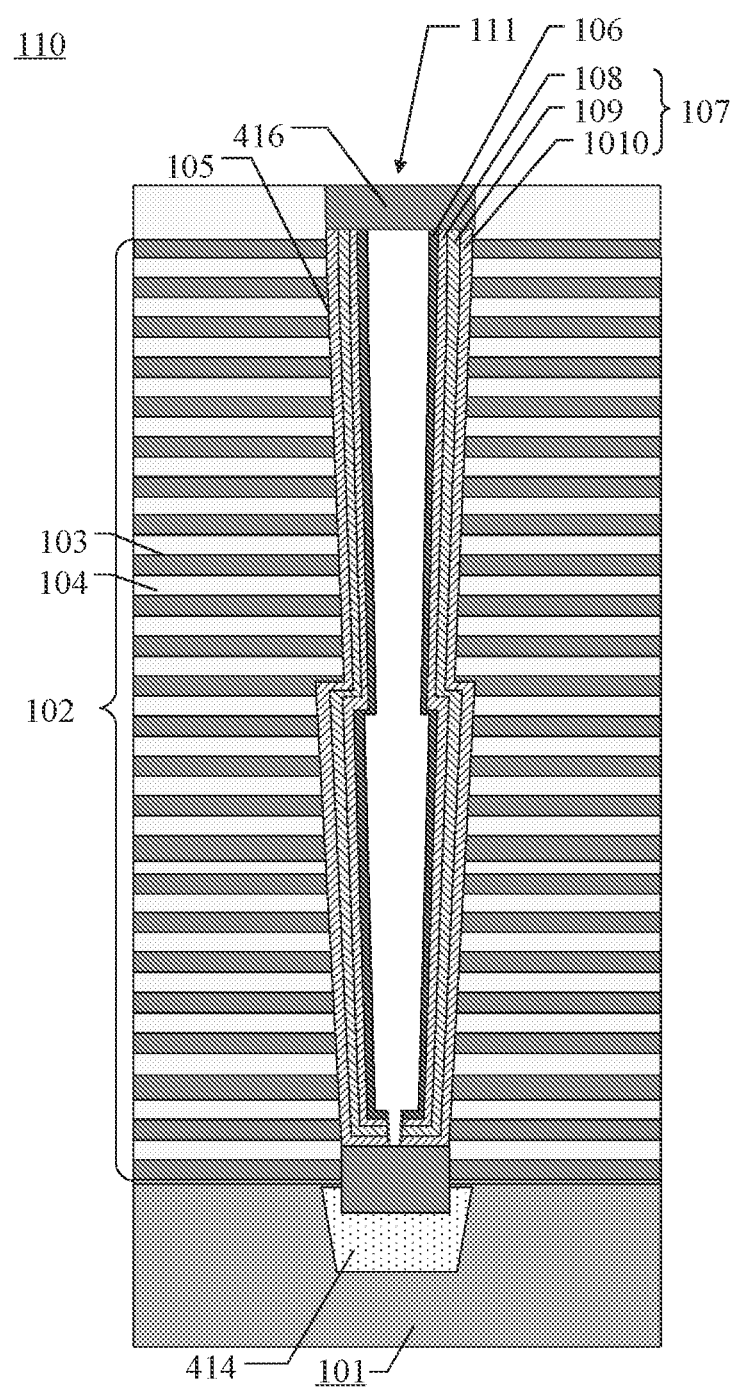
FIG. 6 is a partial cross-sectional view of a memory cell array including NAND memory strings shown according to an implementation of the present disclosure.

FIG. 6 illustrates a side view of a cross-section of a memory cell array 110 including a NAND memory string 111 according to some aspects of the present disclosure. As shown in FIG. 6, the NAND memory string 111 may extend vertically through the memory stack layer 102 above the substrate 101. The substrate 101 may include silicon (e.g., monocrystalline silicon), silicon germanium (SiGe), gallium arsenide (GaAs), germanium (Ge), silicon on insulator (SOI), germanium on insulator (GOI), or any other suitable material.

The memory stack layer 102 may include alternating gate conductive layers 103 and gate-to-gate dielectric layers 104. The number of pairs of gate conductive layer 103 and gate-to-gate dielectric layer 104 in the memory stack layer 102 may determine the number of memory cells 112 in the memory cell array 110.

The gate conductive layer 103 may include a conductive material including but not limited to tungsten (W), cobalt (Co), copper (Cu), aluminum (Al), polysilicon, doped silicon, silicide, or any combination thereof. In some implementations, each gate conductive layer 103 includes a metal layer such as a tungsten layer. In some implementations, each gate conductive layer 103 includes a doped polysilicon layer. Each gate conductive layer 103 may include a control gate around the memory cell 112, and may extend laterally at the top of the memory stack layer 102 as a DSG line 118, extend laterally at the bottom of the memory stack layer 102 as an SSG line 119, or extend laterally between the DSG line 118 and the SSG line 119 as a word line 120.

As shown in FIG. 6, the NAND memory string 111 includes a channel structure 105 that extends vertically through the memory stack layer 102. In some implementations, the channel structure 105 includes channel holes filled with (at least one) semiconductor material (e.g., as a semiconductor channel 106) and (at least one) dielectric material (e.g., as a memory film 107). In some implementations, the semiconductor channel 106 includes silicon, such as polysilicon. In some implementations, the memory film 107 is a composite dielectric layer including a tunneling layer 108, a memory layer 109 (also referred to as a "charge trapping/memory layer"), and a barrier layer 1010. The channel structure 105 may be of a cylindrical shape (e.g., a cylindrical shape). According to some implementations, the semiconductor channel 106, the tunneling layer 108, the memory layer 109, and the barrier layer 1010 are successively arranged radially from the center of the cylinder toward the outer surface of the cylinder. The tunneling layer 108 may include silicon oxide, silicon oxynitride, or any combination thereof. The memory layer 109 may include silicon nitride, silicon oxynitride, or any combination thereof. The barrier layer 1010 may include silicon oxide, silicon oxynitride, high-dielectric-constant (high K) dielectric, or any combination thereof. In one example, the memory film 107 may include a composite layer of silicon oxide/silicon oxynitride/silicon oxide (ONO).

According to some implementations, as shown in FIG. 6, a well 414 (e.g., a P well and/or an N well) is formed in the substrate 101, and the source terminal of the NAND memory string 111 is in contact with the well 414. For example, the source line 116 may be coupled to the well 414, to apply an erase voltage to the well 414 (i.e., the source of the NAND memory string 111) during an erase operation. In some implementations, the NAND memory string 111 further includes a channel plug 416 at the drain terminal of the NAND memory string 111. It should be understood that although not shown in FIG. 6, additional components of the memory cell array 110 may be formed, including but not limited to gate line slits/source contacts, local contacts, interconnected layers and the like.

Referring back to FIG. 5, the peripheral circuit 130 may be coupled to the memory cell array 110 through a bit line 117 a word line 120, a source line 116, an SSG line 119, and a DSG line 118. The peripheral circuit 130 may include any suitable analog, digital, and hybrid signal circuits, for facilitating operation of the memory cell array 110 by applying voltage and/or current signals to and sensing voltage and/or current signals from each target memory cell 112 via the bit line 117, the word line 120, the source line 116, the SSG line 119, and the DSG line 118.

Figure 7:
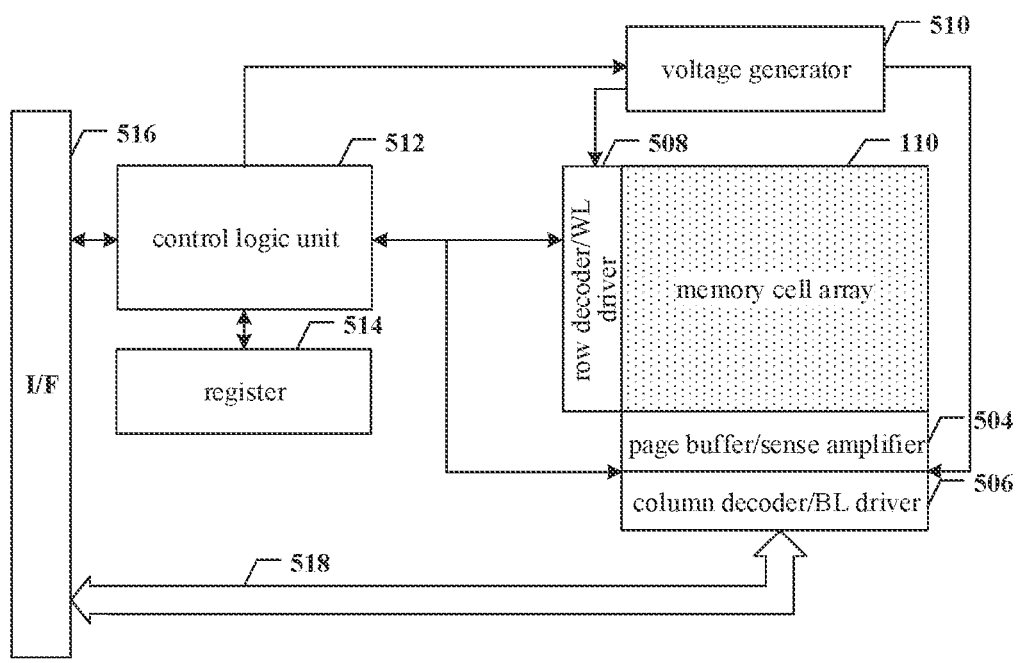
FIG. 7 is a block diagram of a memory device including a memory cell array and a peripheral circuit according to an implementation of the present disclosure.

The peripheral circuit 130 may include various types of peripheral circuits formed using the metal-oxide-semiconductor (MOS) technology. For example, FIG. 7 illustrates some peripheral circuits 130 that include a page buffer/sense amplifier 504, a column decoder/bit line (BL) driver 506, a row decoder/word line (WL) driver 508, a voltage generator 510, a control logic unit 512, a register 514, an interface 516, and a data bus 518. It should be understood that in some examples, an additional peripheral circuit not shown in FIG. 7 may also be included.

The page buffer/sense amplifier 504 may be configured to read data from and program (write) data to the memory cell array 110 according to control signals from the control logic unit 512. In one example, the page buffer/sense amplifier 504 may store one page of programming data (write data) to be programmed into one page 140 of the memory cell array 110. In another example, the page buffer/sense amplifier 504 may execute the program verification operation, to ensure that data has been correctly programmed into the memory cell 112 coupled to the selected word line 120. In yet another example, the page buffer/sense amplifier 504 may further sense a low power signal from the bit line 117 representing data bits stored in the memory cell 112 and amplify a small amplitude of voltage to a recognizable logic level during a read operation. The column decoder/bit line driver 506 may be configured to be controlled by the control logic unit 512 and to select one or more NAND memory strings 111 by applying a bit line voltage generated from the voltage generator 510.

The row decoder/word line driver 508 may be configured to be controlled by the control logic unit 512 and to select/deselect a block 115 of the memory cell array 110 and select/deselect a word line 120 of the block 115. The row decoder/word line driver 508 may further be configured to drive the word line 120 using a word line voltage ($V_{WL}$) generated from the voltage generator 510. In some implementations, the row decoder/word line driver 508 may also select/deselect and drive the SSG line 119 and the DSG line 118. As described in detail below, the row decoder/word line driver 508 is configured to execute an erase operation on the memory cell 112 coupled to the at least one selected word line 120. The voltage generator 510 may be configured to be controlled by the control logic unit 512 and generate a word line voltage (e.g., read voltage, programming voltage, pass voltage, local voltage, verification voltage, etc.), bit line voltage, and source line voltage to be supplied to the memory cell array 110.

The control logic unit 512 may be coupled to each of the peripheral circuits described above and configured to control the operation of each of the peripheral circuits. The register 514 may be coupled to the control logic unit 512 and includes a state register, a command register, an address register for storing state information, a command opcode (OP code), and a command address for controlling the operation of each of the peripheral circuits. The interface 516 may be coupled to the control logic unit 512 and act as a control buffer to buffer and relay control commands received from a host (not shown) to the control logic unit 512 and to buffer and relay state information received from the control logic unit 512 to the host. The interface 516 may further be coupled to the column decoder/bit line driver 506 via the data bus 518 and act as a data I/O interface and a data buffer, to buffer and relay data to the memory cell array 110 or relay or buffer data from the memory cell array 110.

The peripheral circuit 130 is configured to execute the program verification operation according to the implementations of the present disclosure on a selected memory cell row in a plurality of memory cell rows.

Figure 8:
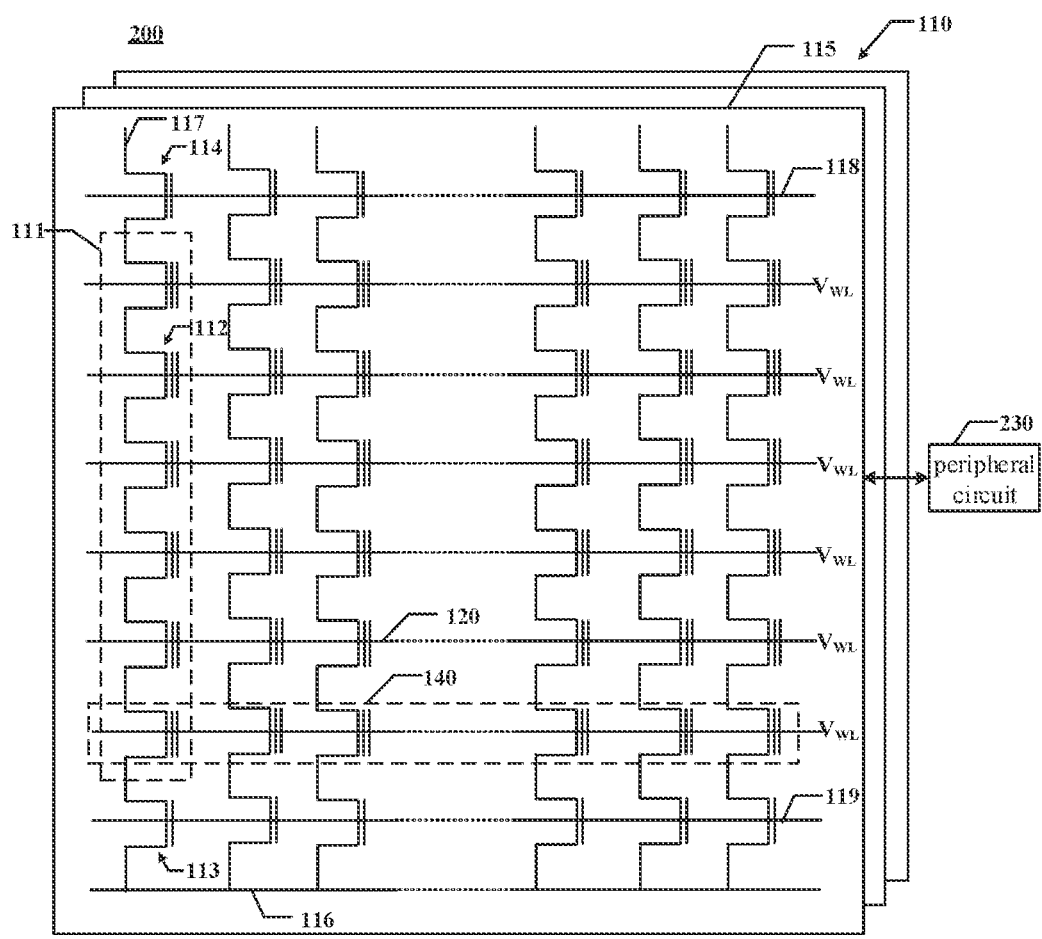
FIG. 8 is a schematic diagram of another memory device shown according to an implementation of the present disclosure.

FIG. 8 is a schematic diagram of a memory device 200 shown according to an implementation. Referring to FIG. 8, the memory device 200 includes a memory cell array 110, a plurality of word lines 120, and a peripheral circuit 230.

The memory cell array 110 includes a plurality of memory cell rows.

The plurality of word lines 120 are coupled to the plurality of memory cell rows, respectively.

The peripheral circuit 230 is coupled to the plurality of word lines 120 and configured to execute a programming operation on a selected memory cell row, the selected memory cell row is coupled to the selected word line. Herein, in order to execute the programming operation, the peripheral circuit 230 is configured to:

apply an $(i+1)^{th}$ programming pulse to a to-be-programmed memory cell in the memory device;

in the process of applying the $(i+1)t^h$ programming pulse, count the fail bits in the programming for the $n^{th}$ state and in the programming for the $(n+k)^{th}$ state in the $i^{th}$ programming operation according to the verification sub-result for the $n^{th}$ state and the verification sub-result for the n+k state in the $i^{th}$ program verification result of the $i^{th}$ program verification operation, to obtain the $i^{th}$ count result. Herein, the programming states verified by the $i^{th}$ program verification operation range from the $n^{th}$ state to the $(n+k)^{th}$ state, i and n are positive integers, k is a natural number, and the $(n+k)^{th}$ state is less than or equal to the highest programming state of the memory device;

determine the range of the programming states to be verified by the $(i+1)^{th}$ program verification operation according to the $i^{th}$ count result; and execute the $(^i+1)^{th}$ program verification operation according to the determined range of the programming states to be verified by the $(i+1)^{th}$ program verification operation.

The peripheral circuit 230 is configured to execute programming operations on a selected memory cell row in a plurality of memory cell rows according to the implementations of the present disclosure.

In some implementations, the structure of the peripheral circuit 230 may be the same as the structure of the peripheral circuit 130.

Figure 9A:
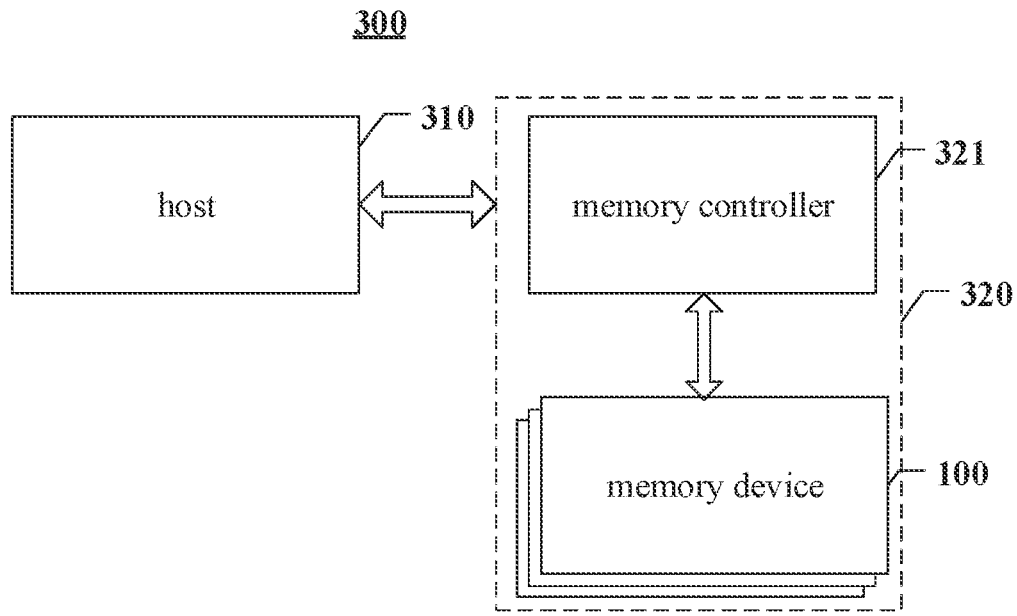
FIG. 9A is a block diagram of a memory system illustrated according to an implementation of the present disclosure.
Figure 9B:
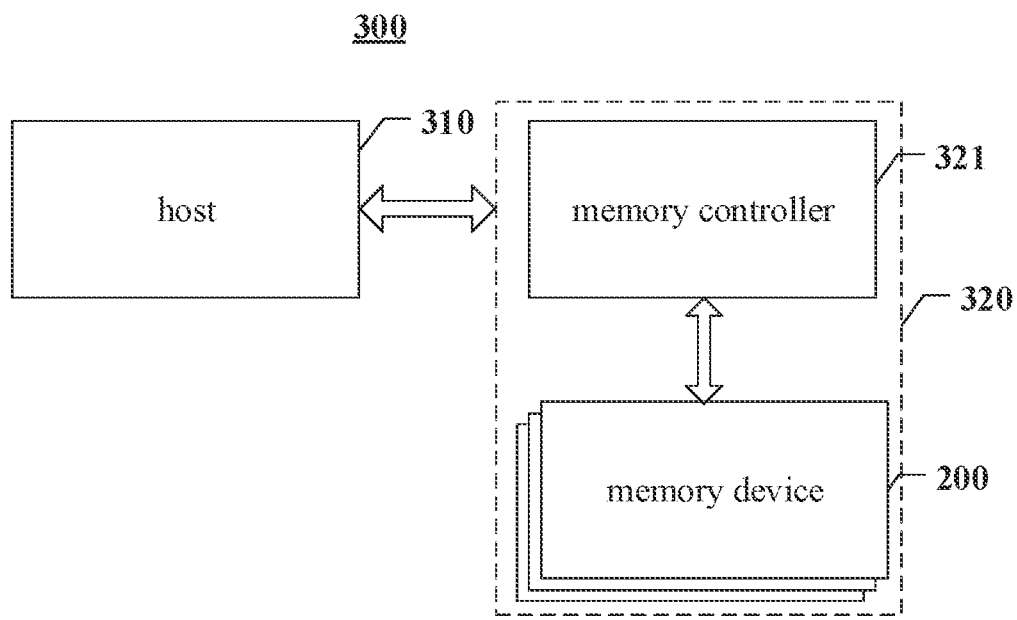
FIG. 9B is a block diagram of another memory system shown according to an implementation of the present disclosure.

FIG. 9A is a schematic diagram of a memory system 300 according to an implementation, and FIG. 9B is a schematic diagram of another memory system 300 according to an implementation. Referring to FIGS. 9A and 9B, the memory system 300 includes:

one or more memory devices 100 or 200; and a memory controller 321 coupled to the memory devices 100 or 200 and configured to control the memory devices 100 or 200.

The system 300 may be a mobile phone, a desktop computer, a laptop computer, a tablet computer, a vehicle computer, a game console, a printer, a positioning device, a wearable electronic device, a smart sensor, a virtual reality (VR) device, an augmented reality (AR) device, or any other suitable electronic device having a memory device therein.

As shown in FIG. 9A, the system 300 may include a host 310 and a memory subsystem 320 having one or more memory devices 100 or 200. The memory subsystem further includes a memory controller 321. The host 310 may be a processor of an electronic device (e.g., a central processing unit (CPU)) or a system-on-chip (SoC) (e.g., an application processor (AP)). The host 310 may be configured to send data to the memory devices 100 or 200. Alternatively, the host 310 may be configured to receive data from the memory devices 100 or 200.

The memory devices 100 or 200 may be any of the memory devices disclosed in the present disclosure. The memory devices 100 or 200 (e.g., a NAND flash memory (e.g., a three-dimensional (3D) NAND flash memory)) may have a reduced leakage current from a drive transistor (e.g., a string driver) coupled to an unselected word line during an erase operation, which allows further reducing the size of the drive transistor.

According to some implementations, the memory controller 321 is further coupled to the host 310. The memory controller 321 may manage data stored in the memories 100 or 200 and communicate with the host 310.

In some implementations, the memory controller 321 is designed for operation in a low duty cycle environment, such as a Secure Digital (SD) card, a Compact Flash (CF) card, a Universal Serial Bus (USB) flash drive, or other media for use in an electronic device such as a personal calculator, a digital camera, a mobile phone, or the like.

In some implementations, the memory controller 321 is designed to operate in a high duty cycle environment, such as a solid state drive (SSD) or an embedded multimedia card (eMMC), which serves as a data storage for mobile devices such as smartphones, tablet computers, laptops, and the like, as well as an enterprise storage array.

The memory controller 321 may be configured to control operations of the memory devices 100 or 200, such as read, erase, and programming operations. The memory controller 321 may further be configured to manage various functions with respect to data stored or to be stored in the memory devices 100 or 200 including but not limited to bad block management, garbage collection, logical-to-physical address translation, wear leveling, and the like. In some implementations, the memory controller 321 is further configured to process error correction codes (ECC) regarding data read from or written to the memories 100 or 200.

The memory controller 321 may also perform any other suitable function such as formatting the memories 100 or 200. The memory controller 321 may communicate with an external device (e.g., host 310) according to a particular communication protocol. For example, the memory controller 321 may communicate with an external device through at least one of various interface protocols, such as the USB protocol, the multimedia card (MMC) protocol, the Peripheral Component Interconnect (PCI) protocol, the PCI express (PCI-E) protocol, the Advanced Technology Attachment (ATA) protocol, the Serial ATA protocol, the Parallel ATA protocol, the Small Computer Small Interface (SCSI) protocol, the Enhanced Small Disk Interface (ESDI) protocol, the Integrated Drive Electronics (IDE) protocol, the Firewire protocol, and etc.

The memory controller 321 and one or more memory devices 100 or 200 may be integrated into various types of memory devices, for example, included in the same package (e.g., Universal Flash Storage (UFS) package or eMMC package). That is, the memory system 100 may be implemented and packaged into different types of terminal electronic devices.

Figure 10A:
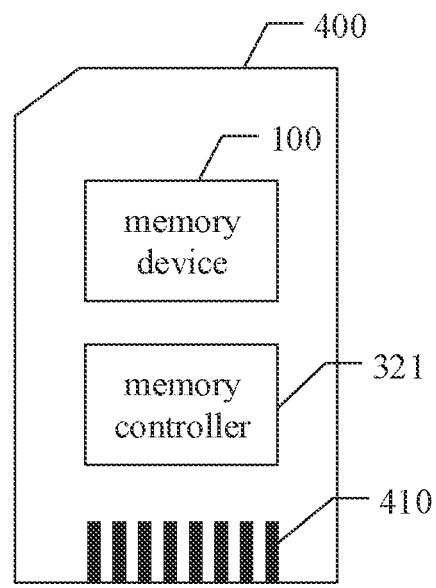
FIG. 10A is a schematic diagram of a memory card shown according to an implementation of the present disclosure.

In an example, as shown in FIG. 10A, the memory controller 321 and the plurality of memory devices 100 may be integrated into a memory card 400. The memory card 400 may include a Personal Computer Memory Card International Association (PCMCIA) card (or referred to as PC card), a CF card, a Smart Media (SM) card, a memory stick, a multimedia card (MMC, RS-MMC, MMCmicro), an SD card (SD, miniSD, microSD, SDHC), a UFS, and the like.

The memory card 400 may further include a memory card connector 410 that couples the memory card 400 to a host (e.g., host 310 in FIG. 9A).

Figure 10B:
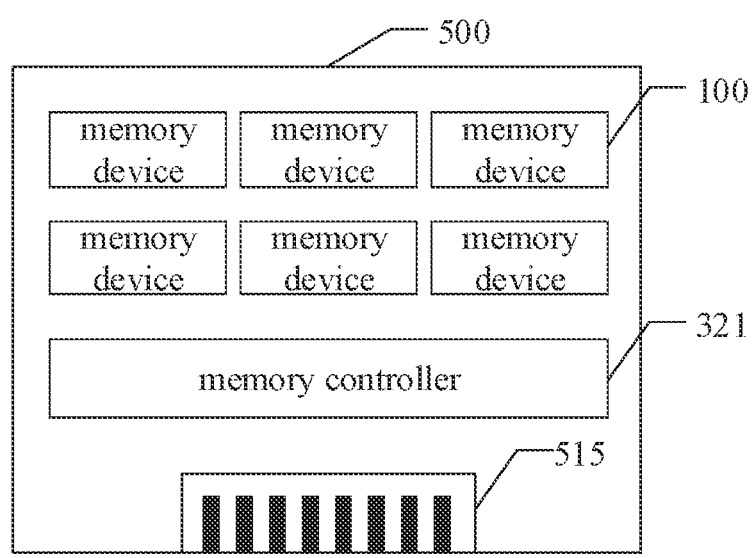
FIG. 10B is a schematic diagram of a solid state drive (SSD) shown according to an implementation of the present disclosure.

In another example as shown in FIG. 10B, the memory controller 321 and a plurality of memory devices 100 may be integrated into a Solid State Drive (SSD) 500. The Solid State Drive 500 may further include a Solid State Drive Connector 515 that couples the Solid State Drive 500 to the host (e.g., the host 310 in FIG. 9A). In some implementations, the storage capacity and/or operating speed of the Solid State Drive 500 is greater than the storage capacity and/or operating speed of the memory card 400.

The memory controller 321 may perform a program verification method or a programming method as provided by any implementation of the present disclosure.

The above description of the memory device implementation is similar to the above description of the method implementation and has similar beneficial effects as the method implementation. Technical details not disclosed in the memory device implementations of the present disclosure are understood with reference to the description of the method implementations of the present disclosure.

It should be understood that references to "some implementations" throughout the specification mean that particular features, structures, or characteristics related to the implementations are included in at least one implementation of the present disclosure. Thus "in some implementations" or "in other implementations" appearing throughout the specification do not necessarily refer to the same implementations. Further, these particular features structures or characteristics may be incorporated in any suitable manner in one or more implementations. In various implementations of the present disclosure, the size of the sequence number of the above-described processes does not mean the order of execution, and the execution order of each process should be determined by its function and inherent logic, and should not constitute any limitation on the implementation process of the present disclosure implementations. The above serial numbers of the implementations of the present disclosure are for description only and do not represent the advantages and disadvantages of the implementations.

It should be noted that, the terms "including," "including," or any other variation thereof are intended to encompass non-exclusive inclusion, so that a process, method, article, or device that includes a set of elements includes not only those elements but also other elements that are not explicitly listed, or also elements inherent to such a process, method, article, or device. In the absence of further limitations, an element defined by the phrase "includes an . . . " does not preclude the existence of another identical element in the process, method, article, or device in which it is included.

The disclosed apparatus and methods may be implemented in other ways. The above-described device implementations are only illustrative, for example, the division of the units is only a logical functional division, which can be implemented in other ways, such as: multiple units or components can be combined, or can be integrated into another system, or some features can be ignored or not performed. In addition, the coupling, or direct coupling, or communication connection between the various components shown or discussed may be indirect coupling or communication connection through some interface, device, or unit, and may be electrical, mechanical, or other forms.

The units described above as separate units may or may not be physically separated and the units displayed as units may or may not be physical units; It can be located in one place or distributed to multiple network elements. Part or all of the units can be selected according to actual needs to achieve the purpose of the implementation scheme.

In addition, each functional unit in each implementation of the present disclosure can be all integrated into one processing unit, each unit can be separate as one unit, and two or more units can be integrated in one unit. The integrated unit can be realized either in the form of hardware or in the form of hardware plus software functional unit.

The above are only implementations of the present disclosure, but the scope of protection of the present disclosure is not limited thereto. Any technician familiar with the technical field can easily think of changes or substitutions within the technical scope of the present disclosure, and should be covered within the scope of protection of the present disclosure. Therefore, the scope of protection of this disclosure shall be subject to the scope of protection of the claims.

The invention claimed is:

1. A program verification method for a memory device, comprising:
   obtaining an verification result of an $i^{th}$ program verification operation, wherein programming states verified by the $i^{th}$ program verification operation range from an $n^{th}$ state to an $(n+k)^{th}$ state, i and n are positive integers, k is a natural number, and the $(n+k)^{th}$ state is less than or equal to a highest programming state of the memory device;
   determining a range of programming states to be verified by an $(i+1)^{th}$ program verification operation according to a verification sub-result for the $n^{th}$ state and a verification sub-result for the $(n+k)^{th}$ state in the $i^{th}$ verification result; and
   executing the $(i+1)^{th}$ program verification operation according to the determined range of the programming states to be verified by the $(i+1)^{th}$ program verification operation.

2. The program verification method of claim 1, wherein determining the range of the programming states to be verified by the $(i+1)^{th}$ program verification operation according to the verification sub-result for the $n^{th}$ state and the verification sub-result for the $(n+k)^{th}$ state in the $i^{th}$ verification result comprises:
   determining a lowest programming state to be verified by the $(i+1)^{th}$ program verification operation according to the verification sub-result for the $n^{th}$ state in the $i^{th}$ verification result; and
   determining a highest programming state to be verified by the $(i+1)^{th}$ program verification operation according to the verification sub-result for the $(n+k)^{th}$ state in the $i^{th}$ verification result.

3. The program verification method of claim 2, wherein the verification result for the $n^{th}$ state in the $i^{th}$ verification result comprises: $i^{th}$ statistical data of the $n^{th}$ state for counting a number of fail bits in programming for the $n^{th}$ state; and
   determining the highest programming state to be verified by the $(i+1)^{th}$ program verification operation according to the verification sub-result for the $(n+k)^{th}$ state in the $i^{th}$ verification result comprises:
   determining the number of fail bits in the programming for the $n^{th}$ state according to the $i^{th}$ statistical data of the $n^{th}$ state; when the number of fail bits in the programming for the $n^{th}$ state is less than a first preset value, determining that the lowest programming state to be verified by the $(^{i+}1)^{th}$ program verification operation is an $(n+1)^{th}$ state; and when the number of fail bits in the programming for the $n^{th}$ state is greater than or equal to the first preset value, determining that the lowest programming state to be verified by the $(i+1)^{th}$ program verification operation is the $n^{th}$ state; or
   when a ratio of the number of fail bits in the programming for the $n^{th}$ state to a number of bits for which a target state is the $n^{th}$ state is less than a first preset ratio, determining that the lowest programming state to be verified by the $(i+_1)^{th}$ program verification operation is the $(n+1)^{th}$ state; and when the ratio of the number of fail bits in the programming for the $n^{th}$ state to the number of bits for which the target state is the $n^{th}$ state is greater than or equal to the first preset ratio, determining the lowest programming state to be verified by the $(i+1)^{th}$ program verification operation to be the $n^{th}$ state.

4. The program verification method of claim 3, further comprising:
   acquiring a number of loops of a to-be-programmed memory cell; and
   determining, according to the number of loops, a value range of the first preset value or a value range of the first preset ratio.

5. The program verification method of claim 3, wherein a value range of the first preset value is within an allowable range of an error correction code error correction mechanism performed on the memory device.

6. The program verification method of claim 2, wherein the verification sub-result for the $(n+k)^{th}$ state in the $i^{th}$ verification result comprises: $i^{th}$ statistical data of the $(n+k)^{th}$ state for counting successful bits in programming for the $(n+k)^{th}$ state; and
   wherein determining the highest programming state to be verified by the $(n+1)^{th}$ program verification operation according to the verification sub-result for the $(n+k)^{th}$ state in the $i^{th}$ verification result comprises:
   determining a number of successful bits in the programming for the $(n+k)^{th}$ state according to $i^{th}$ statistical data of the $(n+k)^{th}$ state; when the number of successful bits in the programming for the $(n+k)^{th}$ state is larger than a second preset value, and the $(n+k)^{th}$ state is smaller than the highest programming state of the memory device, determining that the highest programming state to be verified by the $(i+1)^{th}$ program verification operation is an $(n+k+1)^{th}$ state; and when the number of successful bits in the programming for the $(n+k)^{th}$ state is less than or equal to the second preset value, determining that the highest programming state to be verified by the $(i+1)^{th}$ program verification operation is the $(n+k)^{th}$ state; or,
   when a ratio of the number of successful bits in the programming for the $(n+k)^{th}$ state to a number of bits for which a target state is the $(n+k)^{th}$ state is greater than a second preset ratio, determining that the highest programming state to be verified by the $(i+1)^{th}$ program verification operation is the $(n+k+1)^{th}$ state; and when the ratio of the number of successful bits in the programming for the $(n+k)^{th}$ state to the number of bits for which the target state is the $(n+k)^{th}$ state is less than or equal to the second preset ratio, determining that the highest programming state to be verified by the $(i+1)^{th}$ program verification operation is the $(n+k)^{th}$ state.

7. The program verification method of claim 6, further comprising:
   acquiring a step or a programming voltage slope of an incremental step pulse programming; and determining a value range of the second preset value or a value range of the second preset ratio according to the step or the programming voltage slope; wherein the program verification method is applied to an incremental step pulse programming method; or acquiring a number of loops of a to-be-programmed memory cell; and determining the value range of the second preset value or the value range of the second preset ratio according to the number of loops.

8. The program verification method of claim 6, wherein the second preset ratio ranges from 2% to 3%.

9. The program verification method of claim 1, wherein determining the range of the programming states to be verified by the $(i+1)^{th}$ program verification operation according to the verification sub-result for the $n^{th}$ state and the verification sub-result for the $(n+k)^{th}$ state in the $i^{th}$ verification result comprises:

sampling the verification sub-result for the $n^{th}$ state and the verification sub-result for the $(n+k)^{th}$ state in the $i^{th}$ verification result respectively, to obtain an $i^{th}$ sampling statistical data of the $n^{th}$ state and an $i^{th}$ sampling statistical data of the $(n+k)^{th}$ state;

determining a lowest programming state to be verified by the $(i+1)^{th}$ program verification operation according to the $i^{th}$ sampling statistical data of the $n^{th}$ state; and determining a highest programming state to be verified by the $(i+1)^{th}$ program verification operation according to the $i^{th}$ sampling statistics of the $(n+k)^{th}$ state.

10. A method of programming a memory device, comprising:

applying an $(i+1)^{th}$ programming pulse to to-be-programmed memory cells in the memory device;

in a process of applying the $(i+1)^{th}$ programming pulse, counting fail bits in programming for an $n^{th}$ state and in programming for an $(n+k)^{th}$ state in an $i^{th}$ programming operation according to a verification result for an $n^{th}$ state and a verification result for an $(n+k)^{th}$ state in the $i^{th}$ programming operation, to obtain an $i^{th}$ count result, wherein programming states verified by the $i^{th}$ program verification operation range from the $n^{th}$ state to the $(n+k)^{th}$ state, i and n are positive integers, k is a natural number, and the $(n+k)^{th}$ state is less than or equal to a highest programming state of the memory device;

determining a range of programming states to be verified by an $(i+1)^{th}$ program verification operation according to the $i^{th}$ count result; and executing the $(i+1)^{th}$ program verification operation according to the determined range of the programming states to be verified by the $(i+1)^{th}$ program verification operation.

11. The method of claim 10, wherein the $i^{th}$ count result comprises: a number of fail bits in programming for the $n^{th}$ state in the $i^{th}$ programming operation;

determining the range of programming states to be verified by the $(i+1)^{th}$ program verification operation according to the $i^{th}$ count result comprises:

when a number of fail bits in the programming for the $n^{th}$ state is less than a first preset value, determining that a lowest programming state to be verified by the $(i+1)^{th}$ program verification operation is an $(n+1)^{th}$ state; and when the number of fail bits in the programming for the $n^{th}$ state is greater than or equal to the first preset value, determining that the lowest programming state to be verified by the $(i+1)^{th}$ program verification operation is the $n^{th}$ state;

or when a ratio of the number of fail bits in the programming for the $n^{th}$ state to a number of bits for which a target state is the $n^{th}$ state is less than a first preset ratio, determining that the lowest programming state to be verified by the $(^{i+1})^{th}$ program verification operation is the $(n+1)^{th}$ state; and when the ratio of the number of fail bits in the programming for the $n^{th}$ state to the number of bits for which the target state is the $n^{th}$ state is greater than or equal to the first preset ratio, determining that the lowest programming state to be verified by the $(i+1)^{th}$ program verification operation is the $n^{th}$ state.

12. The method of claim 10, wherein the $i^{th}$ count result comprises: a number of fail bits in the programming for the $(n+k)^{th}$ state in the $i^{th}$ programming operation;

determining the range of programming states to be verified by the $(i+1)^{th}$ program verification operation according to the $i^{th}$ count result comprises:

when a number of successful bits in programming for the $(n+k)^{th}$ state is larger than a second preset value, and the $(n+k)^{th}$ state is smaller than a highest programming state of the memory device, determining that the highest programming state to be verified by the $(i+1)^{th}$ program verification operation is an $(n+k+1)^{th}$ state; and when the number of successful bits in the programming for the $(n+k)^{th}$ state is less than or equal to the second preset value, determining that the highest programming state to be verified by the $(i+1)^{th}$ program verification operation is the $(n+k)^{th}$ state; or when a ratio of the number of successful bits in the programming for the $(n+k)^{th}$ state to a number of bits for which the target state is the $(n+k)^{th}$ state is greater than a second preset ratio, determining that the highest programming state to be verified by the $(i+1)^{th}$ program verification operation is the $(n+k+1)^{th}$ state; and when the ratio of the number of successful bits in the programming for the $(n+k)^{th}$ state to the number of bits for which the target state is the $(n+k)^{th}$ state is less than or equal to the second preset ratio, determining that the highest programming state to be verified by the $(i+1)^{th}$ program verification operation is the $(n+k)^{th}$ state.

13. The method of claim 10, wherein counting fail bits in the programming for the $n^{th}$ state and in the programming for the $(n+k)^{th}$ state in the $i^{th}$ programming operation according to the verification result for the $n^{th}$ state and the verification result for the $(n+k)^{th}$ state in the $i^{th}$ programming operation, to obtain the $i^{th}$ count result comprises:

sampling a verification sub-result for the $n^{th}$ state and a verification sub-result for the $(n+k)^{th}$ state in an $i^{th}$ verification result respectively to obtain $i^{th}$ sampling data of the $n^{th}$ state and the $i^{th}$ sampling data of the $(n+k)^{th}$ state; and counting the fail bits in programming for the $n^{th}$ state and in programming for the $(n+k)^{th}$ state in the $i^{th}$ programming operation based on the $i^{th}$ sampling data of the $n^{th}$ state and the $i^{th}$ sampling data of the $(n+k)^{th}$ state, to obtain the $i^{th}$ count result.

14. A memory device, comprising:

a memory cell array comprising memory cell rows;

word lines respectively coupled to the memory cell rows; and a peripheral circuit coupled to the word lines and configured to execute program verification operation on a selected memory cell row from the memory cell rows, the selected memory cell row coupled to a selected word line, wherein in order to execute the program verification operation, the peripheral circuit is configured to:

obtain an $i^{th}$ verification result of an $i^{th}$ program verification operation, wherein programming states verified by the $i^{th}$ program verification operation range from an $n^{th}$ state to an $(n+k)^{th}$ state, i and n are positive integers, k is a natural number, and the $(n+k)^{th}$ state is less than or equal to a highest programming state of the memory device;

determine a range of programming states to be verified by the $(i+1)^{th}$ program verification operation according to a verification sub-result for the $n^{th}$ state and a verification sub-result for the $(n+k)^{th}$ state in the $i^{th}$ verification result; and execute the $(i+1)^{th}$ program verification operation according to the determined range of programming states to be verified by the $(i+1)^{th}$ program verification operation.

15. The memory device of claim 14, wherein when determining the range of the programming states to be verified by the $(i+1)^{th}$ program verification operation according to the verification sub-result for the $n^{th}$ state and the verification sub-result for the $(n+k)^{th}$ state in the $i^{th}$ verification result, the peripheral circuit is configured to:

determine a lowest programming state to be verified by the $(i+1)^{th}$ program verification operation according to the verification sub-result for the $n^{th}$ state in the $i^{th}$ verification result; and determine a highest programming state to be verified by the $(i+1)^{th}$ program verification operation according to the verification sub-result for the $(n+k)^{th}$ state in the $i^{th}$ verification result.

16. The memory device of claim 15, wherein the verification result for the $n^{th}$ state in the $i^{th}$ verification result comprises: $i^{th}$ statistical data of the $n^{th}$ state for counting a number of fail bits in programming for the $n^{th}$ state, and when determining the highest programming state to be verified by the $(i+1)^{th}$ program verification operation according to the verification sub-result for the $(n+k)^{th}$ state in the $i^{th}$ verification result, the peripheral circuit is configured to:

determine the number of fail bits in the programming for the $n^{th}$ state according to the $i^{th}$ statistical data of the $n^{th}$ state; when the number of fail bits in the programming for the $n^{th}$ state is less than a first preset value, determine that the lowest programming state to be verified by the $(i+1)^{th}$ program verification operation is an $(n+1)^{th}$ state; and when the number of fail bits in the programming for the $n^{th}$ state is greater than or equal to the first preset value, determine that the lowest programming state to be verified by the $(i+1)^{th}$ program verification operation is the $n^{th}$ state; or when a ratio of the number of fail bits in the programming for the $n^{th}$ state to a number of bits for which a target state is the $n^{th}$ state is less than a first preset ratio, determine that the lowest programming state to be verified by the $(i+1)^{th}$ program verification operation is the $(n+1)^{th}$ state; and when the ratio of the number of fail bits in the programming for the $n^{th}$ state to the number of bits for which the target state is the $n^{th}$ state is greater than or equal to the first preset ratio, determine the lowest programming state to be verified by the $(i+1)^{th}$ program verification operation to be the $n^{th}$ state.

17. The memory device of claim 16, wherein the peripheral circuit is further configured to:

acquire a number of loops of a to-be-programmed memory cell; and determine, according to the number of loops, a value range of the first preset value or a value range of the first preset ratio.

18. The memory device of claim 16, wherein a value range of the first preset value is within an allowable range of an error correction code error correction mechanism performed on the memory device.

19. The memory device of claim 15, wherein the verification sub-result for the $(n+k)^{th}$ state in the $i^{th}$ verification result comprises: $i^{th}$ statistical data of the $(n+k)^{th}$ state for counting successful bits in programming for the $(n+k)^{th}$ state, and when determining the highest programming state to be verified by the $(n+1)^{th}$ program verification operation according to the verification sub-result for the $(n+k)^{th}$ state in the $i^{th}$ verification result, the peripheral circuit is configured to:

determine a number of successful bits in the programming for the $(n+k)^{th}$ state according to $i^{th}$ statistical data of the $(n+k)^{th}$ state; when the number of successful bits in the programming for the $(n+k)^{th}$ state is larger than a second preset value, and the $(n+k)^{th}$ state is smaller than the highest programming state of the memory device, determine that the highest programming state to be verified by the $(i+1)^{th}$ program verification operation is an $(n+k+1)^{th}$ state; and when the number of successful bits in the programming for the $(n+k)^{th}$ state is less than or equal to the second preset value, determine that the highest programming state to be verified by the $(i+1)^{th}$ program verification operation is the $(n+k)^{th}$ state; or when a ratio of the number of successful bits in the programming for the $(n+k)^{th}$ state to a number of bits for which a target state is the $(n+k)^{th}$ state is greater than a second preset ratio, determine that the highest programming state to be verified by the $(i+1)^{th}$ program verification operation is the $(n+k+1)^{th}$ state; and when the ratio of the number of successful bits in the programming for the $(n+k)^{th}$ state to the number of bits for which the target state is the $(n+k)^{th}$ state is less than or equal to the second preset ratio, determine that the highest programming state to be verified by the $(i+1)^{th}$ program verification operation is the $(n+k)^{th}$ state.

20. The memory device of claim 19, wherein the peripheral circuit is further configured to:

acquire a step or a programming voltage slope of an incremental step pulse programming; and determine a value range of the second preset value or a value range of the second preset ratio according to the step or the programming voltage slope; or acquire a number of loops of a to-be-programmed memory cell; and determine the value range of the second preset value or the value range of the second preset ratio according to the number of loops.

* * * * *